(12) United States Patent
Hong et al.

(10) Patent No.: US 11,075,610 B2
(45) Date of Patent: Jul. 27, 2021

(54) RECEIVER FOR COMPENSATING COMMON MODE OFFSET

(71) Applicant: Samsung Electronics Co., Ltd., Suwon-si (KR)

(72) Inventors: Seunghwan Hong, Hwaseong-si (KR); Yoo-Chang Sung, Hwaseong-si (KR); Wangsoo Kim, Seoul (KR); Indal Song, Seoul (KR)

(73) Assignee: Samsung Electronics Co., Ltd.

( * ) Notice: Subject to any disclaimer, the term of this patent is extended or adjusted under 35 U.S.C. 154(b) by 50 days.

(21) Appl. No.: 16/654,558

(22) Filed: Oct. 16, 2019

(65) Prior Publication Data
US 2020/0313638 A1 Oct. 1, 2020

(30) Foreign Application Priority Data

Mar. 26, 2019 (KR) ........................ 10-2019-0034590

(51) Int. Cl.
| | | |
|---|---|---|
| *H03F 3/45* | (2006.01) | |
| *H03G 5/16* | (2006.01) | |
| *H03F 3/68* | (2006.01) | |
| *H03F 1/26* | (2006.01) | |
| *H04B 1/16* | (2006.01) | |

(52) U.S. Cl.
CPC ............. *H03G 5/165* (2013.01); *H03F 1/26* (2013.01); *H03F 3/45183* (2013.01); *H03F 3/68* (2013.01); *H04B 1/16* (2013.01); *H03F 2200/129* (2013.01); *H03F 2200/165* (2013.01); *H03F 2200/267* (2013.01); *H03F 2200/375* (2013.01); *H03F 2203/45212* (2013.01)

(58) Field of Classification Search
CPC .......................................................... H03F 3/45
USPC ................................................. 330/253, 260
See application file for complete search history.

(56) References Cited

U.S. PATENT DOCUMENTS

| | | | |
|---|---|---|---|
| 5,216,380 A | 6/1993 | Carbou | |
| 5,455,539 A | 10/1995 | Mazoyer et al. | |
| 6,873,209 B2* | 3/2005 | Takata | H03F 3/45748 330/253 |
| 7,265,620 B2* | 9/2007 | Liu | H03F 1/483 330/253 |
| 7,768,348 B2* | 8/2010 | Banba | H03F 3/45192 330/253 |
| 7,898,323 B2 | 3/2011 | Siegel et al. | |
| 7,948,262 B2 | 5/2011 | Nguyen | |

(Continued)

FOREIGN PATENT DOCUMENTS

| | | |
|---|---|---|
| JP | 3272380 B2 | 4/2002 |
| JP | 3391087 B2 | 3/2003 |
| JP | 5439590 B2 | 3/2014 |

*Primary Examiner* — Henry Choe
(74) *Attorney, Agent, or Firm* — Myers Bigel, P.A.

(57) ABSTRACT

A receiver includes an amplifier that receives a transmission signal and amplifies a first voltage difference between the transmission signal and a reference signal to generate a first output signal and a second output signal at a first node and a second node. An equalizer is provided, which is connected to the first node and the second node and receives the transmission signal. The equalizer compensates a common-mode offset between the first output signal and the second output signal based on a second voltage difference between an average voltage level of the transmission signal and the reference signal.

18 Claims, 18 Drawing Sheets

(56) References Cited

U.S. PATENT DOCUMENTS

| | | |
|---|---|---|
| 8,634,452 B2 | 1/2014 | Zerbe et al. |
| 8,638,838 B1 | 1/2014 | Betts et al. |
| 8,937,994 B2 | 1/2015 | Amirkhany et al. |
| 9,118,469 B2 | 8/2015 | Malkin et al. |
| 9,614,564 B2 | 4/2017 | Chang et al. |
| 9,614,697 B2 | 4/2017 | Chang et al. |
| 10,128,965 B1 | 11/2018 | Wilson et al. |

* cited by examiner

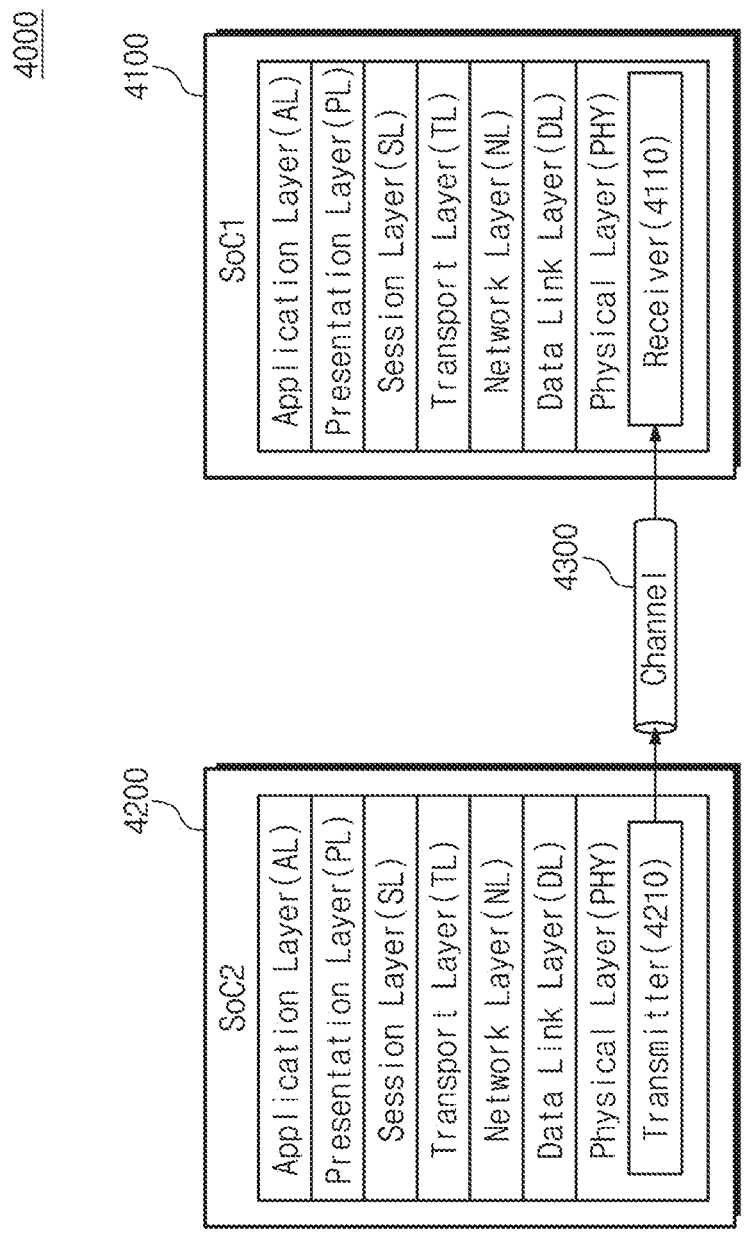

RECEIVER FOR COMPENSATING COMMON MODE OFFSET

REFERENCE TO PRIORITY APPLICATION

This application claims priority under 35 U.S.C. § 119 to Korean Patent Application No. 10-2019-0034590, filed Mar. 26, 2019, the disclosure of which is hereby incorporated herein by reference.

BACKGROUND

Embodiments of the inventive concept disclosed herein relate to receivers and, more particularly, to receivers having improved common mode offset characteristics.

In high-speed serial link systems, data bits may be transmitted in series through a channel. In the case where a signal is transmitted through a channel, such as a coaxial cable or a PCB trace, the bandwidth of the channel may be restricted due to a load, a skin effect, and a dielectric loss of the channel, and a high-frequency component of a signal may weaken at a receiving end. In particular, the reliability of a high-speed serial link system may decrease due to inter-symbol interference (ISI), which is a form of distortion of a signal in which one symbol interferes with subsequent symbols.

A receiver may include an equalizer for compensating a loss of a high-frequency component. The channel may weaken a high-frequency component of a signal, but the equalizer may enhance or boost a high-frequency component of a signal. However, because the equalizer does not distinguish a component of a signal distorted by the ISI and a component of a signal distorted by reflection noise, etc., all high-frequency components of a signal may be amplified.

SUMMARY

Embodiments of the inventive concept provide a receiver with built-in compensation for common mode offset.

According to an exemplary embodiment, a receiver includes an amplifier that receives a transmission signal and amplifies a first voltage difference between the transmission signal and a reference signal to generate a first output signal and a second output signal at a first node and a second node, respectively. An equalizer is also provided that is connected to the first node and the second node and receives the transmission signal. The equalizer is configured to compensate a common-mode offset between the first output signal and the second output signal based on a second voltage difference between an average voltage level of the transmission signal and the reference signal.

According to another exemplary embodiment, a receiver includes an amplifier that receives a transmission signal and amplifies a voltage difference between the transmission signal and a reference signal to generate a first output signal and a second output signal at a first node and a second node. An equalizer is provided, which is connected to the first node and the second node and generates a first feedback signal and a second feedback signal based on the first output signal and the second output signal, respectively. The equalizer is also configured to compensate a common-mode offset between the first output signal and the second output signal based on the first feedback signal and the second feedback signal.

According to a further exemplary embodiment, a receiver includes a first transistor that receives a single-ended signal, a second transistor that receives a reference signal, a third transistor that is connected to a first node to which the first transistor is connected, and a fourth transistor that is connected to a second node to which the second transistor is connected. The first transistor and the second transistor are configured to amplify a first voltage difference between the single-ended signal and the reference signal to generate a first output signal and a second output signal at the first node and the second node, and the third transistor and the fourth transistor are configured to compensate a common-mode offset between the first output signal and the second output signal based on a second voltage difference between an average voltage level of the single-ended signal and the reference signal.

According to still further embodiments of the inventive concept, a receiver is provided with a main differential amplifier and an equalizer. The main differential amplifier has first and second input terminals responsive to first and second inputs signals, respectively, and first and second output terminals. The equalizer is electrically coupled to at least one of the first and second output terminals and is responsive to at least the first input signal. The equalizer is configured to improve common-mode offset characteristics of the main differential amplifier by loading at least one of the first and second output terminals to reduce a common-mode offset voltage therebetween. The equalizer can include a first differential amplifier having first and second input terminals responsive to the first and second input signals, respectively. In some of these embodiments, the first differential amplifier is equivalent to the main differential amplifier. In further embodiments, the equalizer may include a second differential amplifier having a first input terminal electrically coupled by a first low pass filter (e.g., RC network) to a first output terminal of the first differential amplifier and a second input terminal electrically coupled by a second low pass filter (e.g., RC network) to a second output terminal of the first differential amplifier. This second differential amplifier also has a first output terminal electrically coupled to the first output terminal of the main differential amplifier and a second output terminal electrically coupled to a second output terminal of the main differential amplifier.

According to additional embodiments of the inventive concept, a receiver is provided having a main differential amplifier and an equalizer. The main differential amplifier has first and second input terminals, which are responsive to first and second inputs signals, respectively, and first and second output terminals. An equalizer is also provided, which is electrically coupled to the first and second output terminals and responsive to at least one of the first and second input signals. The equalizer is configured to at least partially cancel a common-mode offset between the first and second output terminals. In some of these embodiments, the equalizer includes a current adjusting circuit having first and second output terminals electrically connected to the first and second output terminals of the main differential amplifier. The equalizer may also include a first differential amplifier having matched characteristics relative to the main differential amplifier, and may be responsive to the first and second input signals. A first low pass filter may also be provided, which electrically couples a first output of the first differential amplifier to a first input of the current adjusting circuit, and a second low pass filter, which electrically couples a second output of the differential amplifier to a second input of the current adjusting circuit.

BRIEF DESCRIPTION OF THE FIGURES

The above and other objects and features of the inventive concept will become apparent by describing in detail exemplary embodiments thereof with reference to the accompanying drawings.

FIG. 18 illustrates a block diagram of an electronic device to which a receiver according to an embodiment of the inventive concept is applied.

DETAILED DESCRIPTION

Figure 1:
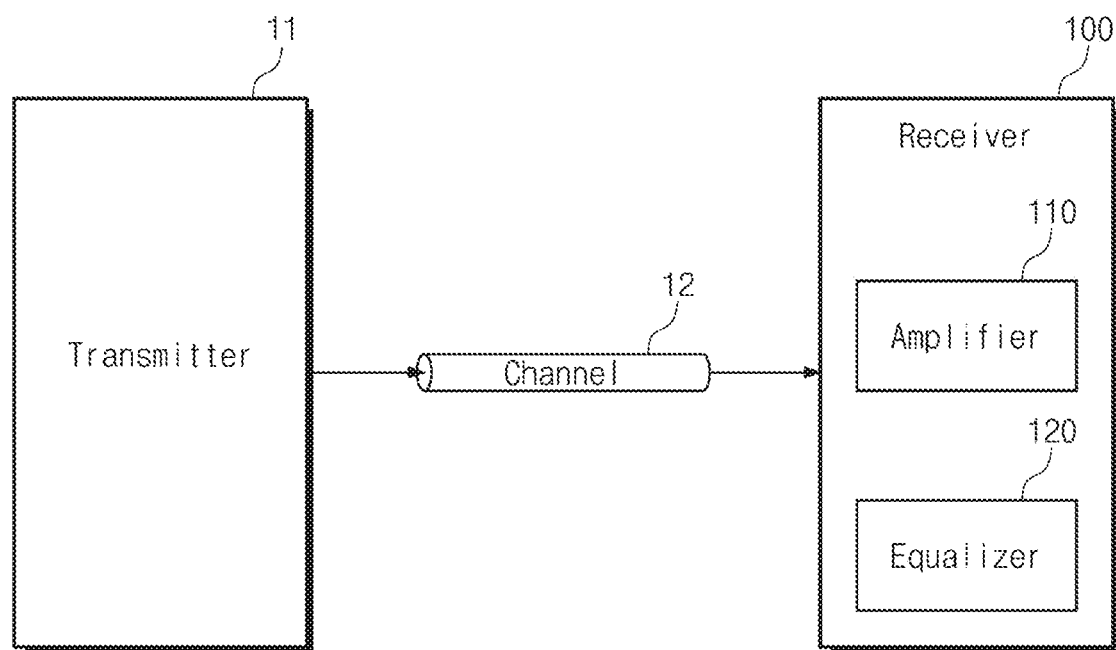
FIG. 1 illustrates a block diagram of a transceiver according to an embodiment of the inventive concept.

FIG. 1 illustrates a block diagram of a transceiver according to an embodiment of the inventive concept. A transceiver 10 may include a transmitter 11 and a receiver 100 that communicate with each other over a channel 12. A transceiver may be also referred to as a "data transmitter/receiver circuit", a "serializer/deserializer (SERDES)", or a "high-speed data transmission system".

The transmitter 11 may transmit a signal corresponding to data to the receiver 100 through (over) the channel 12. The channel 12, the number of pins of an integrated circuit in which the transmitter 11 is implemented, and the number of pins of an integrated circuit in which the receiver 100 is implemented may increase costs necessary to implement the transceiver 10. To reduce costs necessary to implement the above components, the transmitter 11 may transmit a signal including serialized bits of data.

For example, the transmitter 11 may transmit a signal in a single-ended signaling manner. The receiver 100 may receive a signal transmitted from the transmitter 11 through the channel 12 and may compare the transmitted signal and a reference signal to determine bits of the transmitted signal. For another example, the transmitter 11 may transmit a pair of signals in a double-ended signaling manner or a differential signaling manner. The receiver 100 may receive signals transmitted from the transmitter 11 through the channel 12 and may compare the transmitted signals to determine bits of the transmitted signals. The number of channels necessary to implement the single-ended signaling may be less than the number of channels necessary to implement the double-ended signaling. Below, the single-ended signaling will be mainly described, but the inventive concept may be applied to both the single-ended signaling and the double-ended signaling.

The channel 12 may be a path that physically or electrically connects the transmitter 11 and the receiver 100. For example, the channel 12 may be implemented by using a trace of a printed circuit board (PCB) or a coaxial cable. A skin effect, a dielectric loss, etc. of the channel 12 may cause a deterioration in a high-frequency component of data transmitted through the channel 12. When a signal is conveyed through the channel 12, a channel loss may occur in the receiver 100. Also, impedance discontinuity (mismatch) may occur in the channel 12 due to connectors between boards and cables, and any other physical interfaces. The impedance discontinuity of the channel 12 may appear as a notch at a frequency response of the channel 12 and may cause a reflection noise at the receiver 100. Each of bits of data passing through the channel 12 may disturb a subsequent bit(s) due to the channel loss or the limitation on a bandwidth, and a phenomenon in which a bit error rate increases due to the overlapping of neighboring symbols, that is, the inter symbol interference (ISI) may occur.

The receiver 100 may receive a signal from the transmitter 11 through the channel 12. The receiver 100 may include an amplifier 110 and an equalizer 120 for recovering a transmitted signal or compensating the channel loss. The amplifier 110 may detect and amplify the transmitted signal. The equalizer 120 may have a characteristic that is opposite to a characteristic of the channel 12. For example, the channel 12 may have the same frequency response characteristic as a low pass filter, and the equalizer 120 may have the same frequency response characteristic as a high pass filter.

Figure 2:
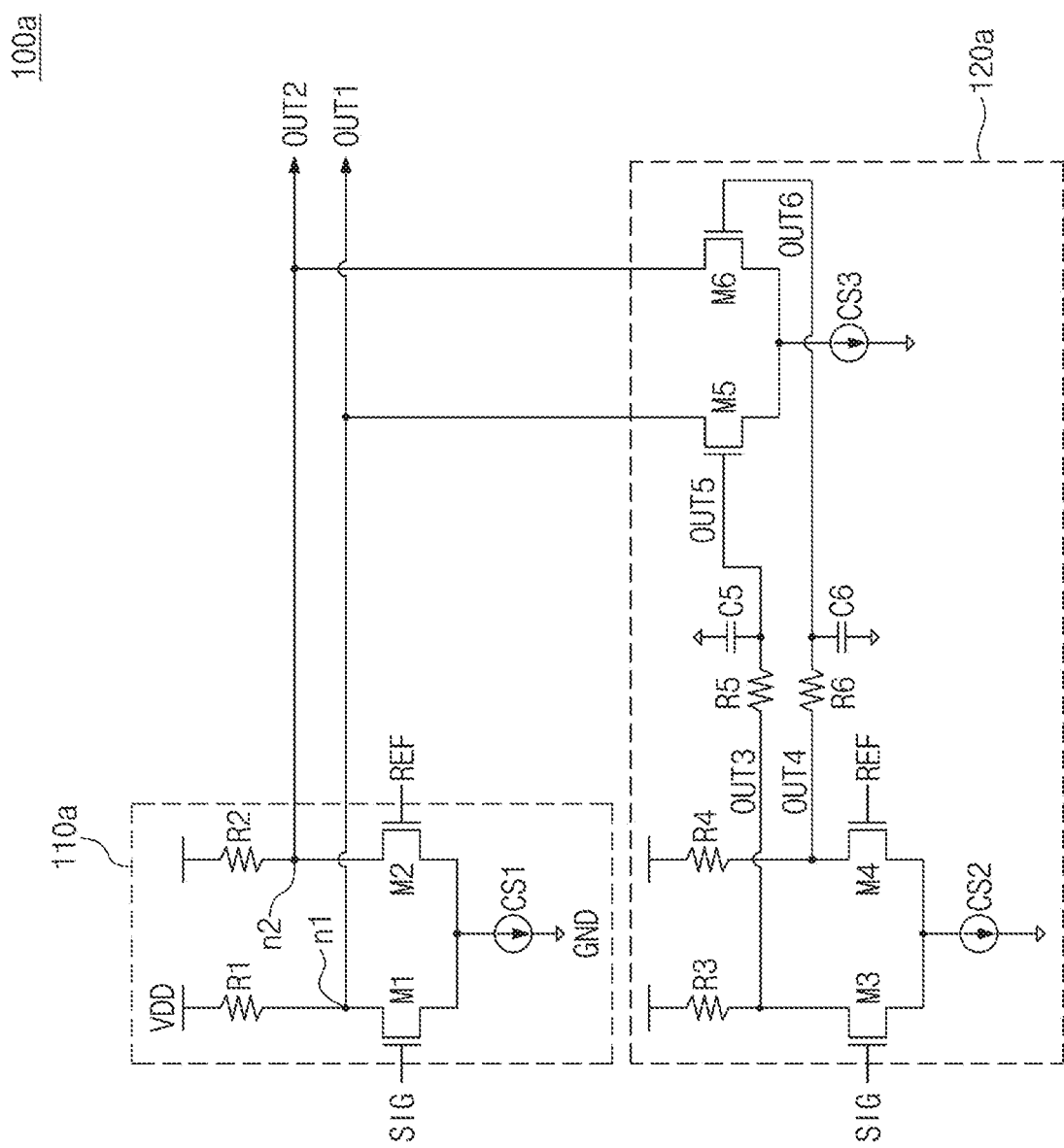
FIG. 2 illustrates a block diagram of a receiver of FIG. 1 according to an embodiment of the inventive concept.

FIG. 2 illustrates a block diagram of a receiver of FIG. 1 according to an embodiment of the inventive concept. A receiver 100a that is an example of the receiver 100 of FIG. 1 may include an amplifier 110a and an equalizer 120a.

The amplifier 110a may include transistors M1 and M2, resistors R1 and R2, and a current source CS1. A transmission signal SIG may be transmitted from the transmitter 11 to the receiver 100a through the channel 12. In the single-ended signaling, a reference signal REF may be generated in an integrated circuit in which the receiver 100a is implemented or may be provided from an external device (e.g., an integrated circuit in which the transmitter 11 is implemented or a separate electronic device). In the double-ended signaling, as in the transmission signal SIG, the reference signal REF may be transmitted to the receiver 100a from the transmitter 11 through the channel 12. In both cases, the amplifier 110a may compare the transmission signal SIG and the reference signal REF, may amplify a voltage difference between the transmission signal SIG and the reference signal REF, and may generate output signals OUT1 and OUT2 at nodes n1 and n2. The amplifier 110a may determine voltage levels of the output signals OUT1 and OUT2 based on a result of comparing the transmission signal SIG and the reference signal REF, and the voltage levels of the output signals OUT1 and OUT2 may be determined depending on a logical value of a bit of data transmitted from the transmitter 11.

The transmission signal SIG may be input to a gate terminal of the transistor M1. A source terminal (e.g., a first terminal) of the transistor M1 may be connected to the current source CS1, and a drain terminal (e.g., a second terminal) of the transistor M1 may be connected to the node n1 and the resistor R1. The transistor M1 may control the amount of current flowing between the drain terminal and the source terminal depending on the transmission signal SIG and may be referred to as a "switch". The reference signal REF may be input to a gate terminal of the transistor M2. A source terminal of the transistor M2 may be connected to the current source CS1, and a drain terminal of the transistor M2 may be connected to the node n2 and the resistor R2.

The current source CS1 may generate a bias current flowing through the transistors M1 and M2. A gain of the amplifier 110a may vary depending on a magnitude of the bias current. The amplifier 110a may be also referred to as a "variable gain amplifier (VGA)". The current source CS1 may be implemented with a transistor that has a gate terminal configured to receive a bias voltage, a drain terminal connected to the transistors M1 and M2, and a source terminal connected to a power supply voltage GND (or a ground voltage).

The resistor R1 may be connected between a power supply voltage VDD and the drain terminal of the transistor M1. The resistor R2 may be connected between the power supply voltage VDD and the drain terminal of the transistor M2. Each of the resistors R1 and R2 may be implemented with a passive element or a transistor. For example, voltage levels and swing levels of the output signals OUT1 and OUT2 may be determined according to the resistors R1 and R2, the bias current, a voltage difference between the transmission signal SIG and the reference signal REF.

The transistors M1 and M2 may be implemented to be the same, and the resistors R1 and R2 may be implemented to be the same. The amplifier 110a may be a symmetrical differential amplifier. Compared with a typical complementary metal-oxide semiconductor (CMOS) circuit, the amplifier 110a may be a current mode logic (CML) circuit that decreases or restricts an amplitude of a swing of the output signals OUT1 and OUT2 for a high-speed operation.

The equalizer 120a may include transistors M3 and M4, resistors R3 and R4, and a current source CS2, which configure an amplifier. Operations of the components M3, M4, R3, R4, and CS2 of the amplifier in the equalizer 120a may be substantially the same as the operations of the components M1, M2, R1, R2, and CS1 of the amplifier 110a. For example, the amplifier of the equalizer 120a that is a replica circuit of the amplifier 110a may be implemented to be substantially the same as the amplifier 110a.

The equalizer 120a may also include resistors R5 and R6 and capacitors C5 and C6 that configure low pass filters. The resistor R5 and the capacitor C5 may be a low pass filter that filters an output signal OUT3 and generates an output signal OUT5. The resistor R6 and the capacitor C6 may be a low pass filter that filters an output signal OUT4 and generates an output signal OUT6. A low pass filter may be referred to as a "filtering circuit". For example, the capacitors C5 and C6 may be implemented with MOS transistors, metal insulator metal (MIM) capacitors, passive elements, etc.

A switching, a toggling, or a transition of the transmission signal SIG may be reflected in the output signals OUT3 and OUT4 without modification. The output signals OUT3 and OUT4 may be switched at a transmission speed of the transmission signal SIG by the amplifier of the equalizer 120a. The low pass filters (R5, C5) and (R6, C6) may filter high-frequency components of the output signals OUT3 and OUT4. The output signals OUT5 and OUT6 may be similar to a DC signal. A voltage level of the output signal OUT5 may be an average voltage level of the output signal OUT3. A voltage level of the output signal OUT6 may be an average voltage level of the output signal OUT4. For example, an average voltage level may be referred to as a "common mode voltage level".

The equalizer 120a may further include transistors M5 and M6 and a current source CS3 that configure a current adjusting circuit. The output signal OUT5 may be input to a gate terminal of the transistor M5. A source terminal of the transistor M5 may be connected to the current source CS3, and a drain terminal of the transistor M5 may be connected to the node n1 at which an output signal OUT1 is generated. The output signal OUT6 may be input to a gate terminal of the transistor M6. A source terminal of the transistor M6 may be connected to the current source CS3, and a drain terminal of the transistor M6 may be connected to the node n2 at which an output signal OUT2 is generated. The current source CS3 may generate a bias current flowing through the transistors M5 and M6. The current source CS3 may be implemented with a transistor that has a gate terminal configured to receive a bias voltage, a drain terminal connected to the transistors M5 and M6, and a source terminal connected to the ground reference voltage GND.

A voltage difference may be present between an average voltage level of the transmission signal SIG and an actual voltage level (or an average voltage level) of the reference signal REF. The voltage difference may be referred to as a "common-mode offset". A rank margin tool (RMT) may be used to verify an operation of the receiver 100a. The voltage level of the reference signal REF may be swept within a given range in the unit of a step. Evaluation may be made with respect to a voltage margin and a timing margin, which the receiver 100a determines, detects, or samples the transmission signal SIG effectively, or an eye diagram. When the voltage level of the reference signal REF is swept, the common-mode offset may occur between the transmission signal SIG and the reference signal REF. Also, in the case of the single-ended signaling, the transmission signal SIG may be transmitted from the outside of an integrated circuit including the receiver 100, and the reference signal REF may be generated within the integrated circuit as a fixed voltage. A transmission environment of the transmission signal SIG and a process, voltage, and temperature (PVT) variation may cause a significant common-mode offset between the transmission signal SIG and the reference signal REF.

The transmission signal SIG and the reference signal REF that are input to the amplifier 110a may be expressed as a sum of a differential input and a common-mode input. The differential input may correspond to a voltage difference between the transmission signal SIG and the reference signal REF, and the common-mode input may be common to both the transmission signal SIG and the reference signal REF and may correspond to an average voltage of the transmission signal SIG and the reference signal REF. The amplifier 110a may amplify the differential input and may suppress the common-mode input. The performance of the amplifier 110a described above may be evaluated as a common-mode rejection ratio (CMRR). The common-mode offset may degrade the degree to which a differential input is amplified by the amplifier 110a, the degree to which a common-mode input is suppressed by the amplifier 110a, the CMRR of the amplifier 110a, an AC amplification factor of the amplifier 110a, etc. The common-mode offset may decrease a voltage margin or a timing margin, which the receiver 100a requires to detect or sample the transmission signal SIG effectively (i.e., correctly).

The equalizer 120a may compensate the common-mode offset. When the common-mode offset occurs between the transmission signal SIG and the reference signal REF, a voltage difference (i.e., a common-mode offset) may occur between average voltage levels of the output signals OUT1 and OUT2 of the amplifier 110a. As in the above description, a voltage difference (i.e., a common-mode offset) may occur between average voltage levels of the output signals OUT3 and OUT4 of the amplifier in the equalizer 120a. The voltage level of the output signal OUT5 may be an average voltage level of the output signal OUT3 by the low pass filter (R5, C5), and the voltage level of the output signal OUT6 may be an average voltage level of the output signal OUT4 by the low pass filter (R6, C6). A voltage difference (i.e., a common-mode offset) may occur between voltage levels of the output signals OUT5 and OUT6. The common-mode offset between the output signals OUT1 and OUT2, the common-mode offset between the output signals OUT3 and OUT4, and the common-mode offset between the output signals OUT5 and OUT6 all may occur due to the common-mode offset between the transmission signal SIG and the reference signal REF.

The current adjusting circuit of the equalizer 120a may automatically compensate for the common-mode offset between the output signals OUT1 and OUT2, based on the common-mode offset between the transmission signal SIG and the reference signal REF. Depending on the output signal OUT5, the transistor M5 may adjust or sink a current from the node n1, may adjust the amount of current flowing from the node n1 to the power supply voltage GND, and may adjust a voltage level of the output signal OUT1. Depending on the output signal OUT6, the transistor M6 may adjust or sink a current from the node n2, may adjust the amount of current flowing from the node n2 to the power supply voltage GND, and may adjust a voltage level of the output signal OUT2.

It is assumed that an average voltage level of the transmission signal SIG is higher than a voltage level of the reference signal REF. An average voltage level of the output signal OUT3 may be lower than an average voltage level of the output signal OUT4. A (average) voltage level of the output signal OUT5 may be lower than a (average) voltage level of the output signal OUT6. The amount of current flowing through the transistor M5 depending on the output signal OUT5 may be smaller than the amount of current flowing through the transistor M6 depending on the output signal OUT6. A magnitude (amplitude) by which a voltage level of the output signal OUT1 is decreased (or adjusted) by the transistor M5 may be smaller than a magnitude by which a voltage level of the output signal OUT2 is decreased (or adjusted) by the transistor M6. In this manner, the transistors M5 and M6 of the equalizer 120a may adjust the amounts of current flowing through the transistors M5 and M6 in order to remove or decrease a voltage difference between average voltage levels of the output signals OUT1 and OUT2 due to the common-mode offset between the transmission signal SIG and the reference signal REF. The common-mode offset between the output signals OUT1 and OUT2, which occurs due to the common-mode offset between the transmission signal SIG and the reference signal REF, may be compensated, removed, decreased, or suppressed by the equalizer 120a. The equalizer 120a may be referred to as a "common-mode offset compensation circuit".

In an embodiment, the receiver 100a may further include a CML2CMOS circuit (not illustrated) that receives the output signals OUT1 and OUT2 and generates a digital signal having a logic value of "0" or "1". As described above, components of the receiver 100a illustrated in FIG. 2 may be configured as CML circuits.

In an embodiment, an example is illustrated in FIG. 2 as all the transistors M1 to M6 of the receiver 100a are implemented with NMOS transistors, but the inventive concept is not limited thereto. The transistors M1 to M6 may be implemented with PMOS transistors or a combination of NMOS transistors and PMOS transistors.

Figure 3:
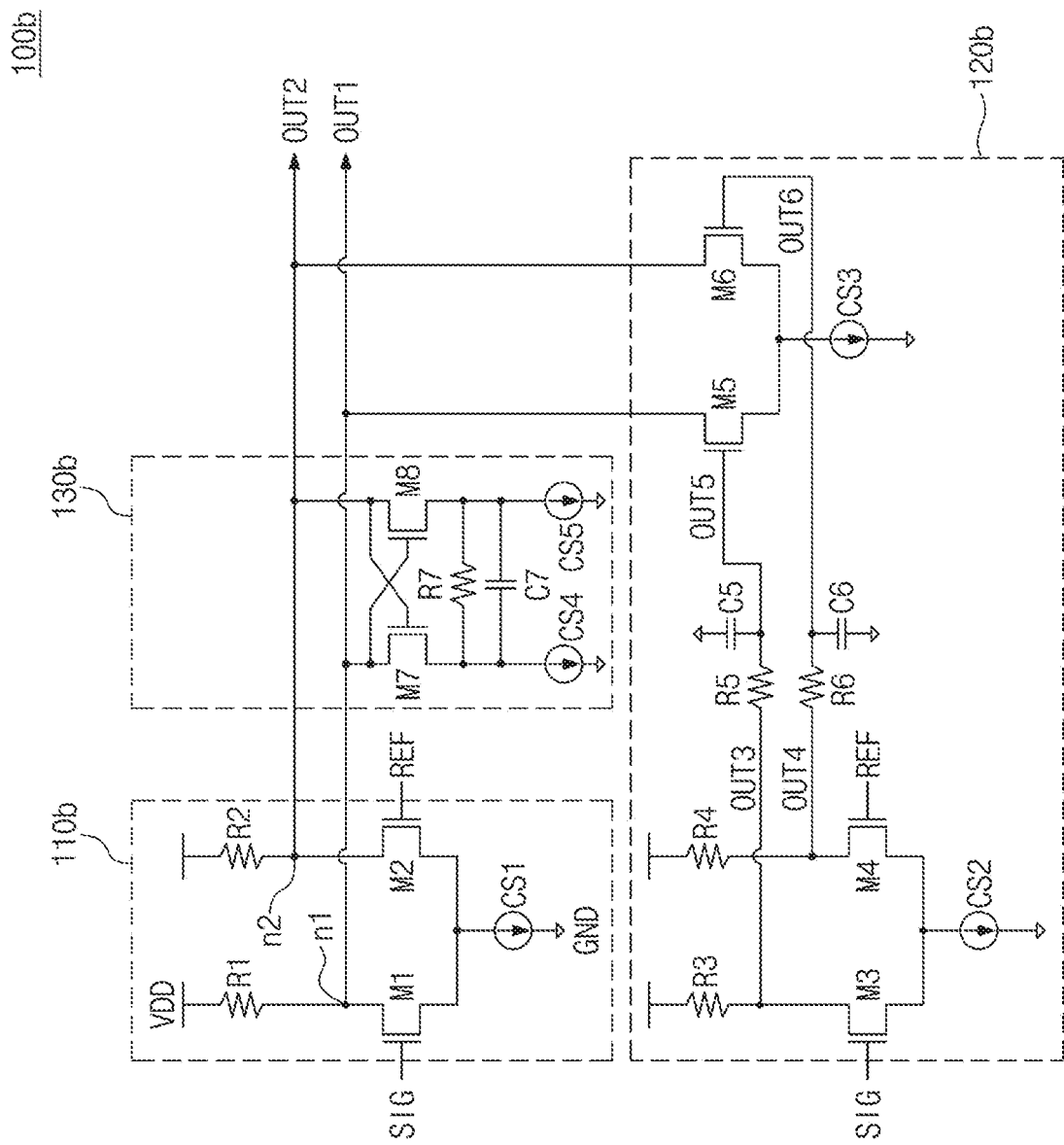
FIG. 3 illustrates a block diagram of a receiver of FIG. 1 according to another embodiment of the inventive concept.

FIG. 3 illustrates a block diagram of a receiver of FIG. 1 according to another embodiment. A receiver 100b that is an example of the receiver 100 of FIG. 1 may include an amplifier 110b, an equalizer 120b, and an equalizer 130b. Configurations and operations of the amplifier 110b and the equalizer 120b of FIG. 3 are substantially the same as the configurations and the operations of the amplifier 110a and the equalizer 120a of FIG. 2. A difference between the receiver 100b FIG. 3 and the receiver 100a of FIG. 2 will be mainly described.

The equalizer 130b may include transistors M7 and M8, a resistor R7, a capacitor C7, and current sources CS4 and CS5. A drain terminal of the transistor M7 and a gate terminal of the transistor M8 may be connected to the node n1. A gate terminal of the transistor M7 and a drain terminal of the transistor M8 may be connected to the node n2. A source terminal of the transistor M7 may be connected to the current source CS4, a first end of the resistor R7, and a first end of the capacitor C7. A source terminal of the transistor M8 may be connected to the current source CS5, a second end of the resistor R7, and a second end of the capacitor C7. Thus, the transistors M7 and M8 may form a cross-coupled pair.

The current source CS4 may generate a bias current flowing through the transistor M7. The current source CS5 may generate a bias current flowing through the transistor M8. Each of the current sources CS4 and CS5 may be implemented with a transistor that has a gate terminal configured to receive a bias voltage, a drain terminal connected to the corresponding one of the transistors M7 and M8, and a source terminal connected to the power supply voltage GND.

The equalizer 130b may amplify, compensate, or recover a high-frequency component of the transmission signal SIG, which weakens due to the channel loss. The equalizer 130b may be a high pass filter that boosts high-frequency components of the output signals OUT1 and OUT2. The transistors M7 and M8 may amplify the output signals OUT1 and OUT2 in a positive feedback manner. The equalizer 130b may provide a negative impedance or a negative capacitance to the nodes n1 and n2. The equalizer 130b may be a negative capacitance equalizer (NCE) or a continuous time linear equalizer (CTLE).

Figure 4:
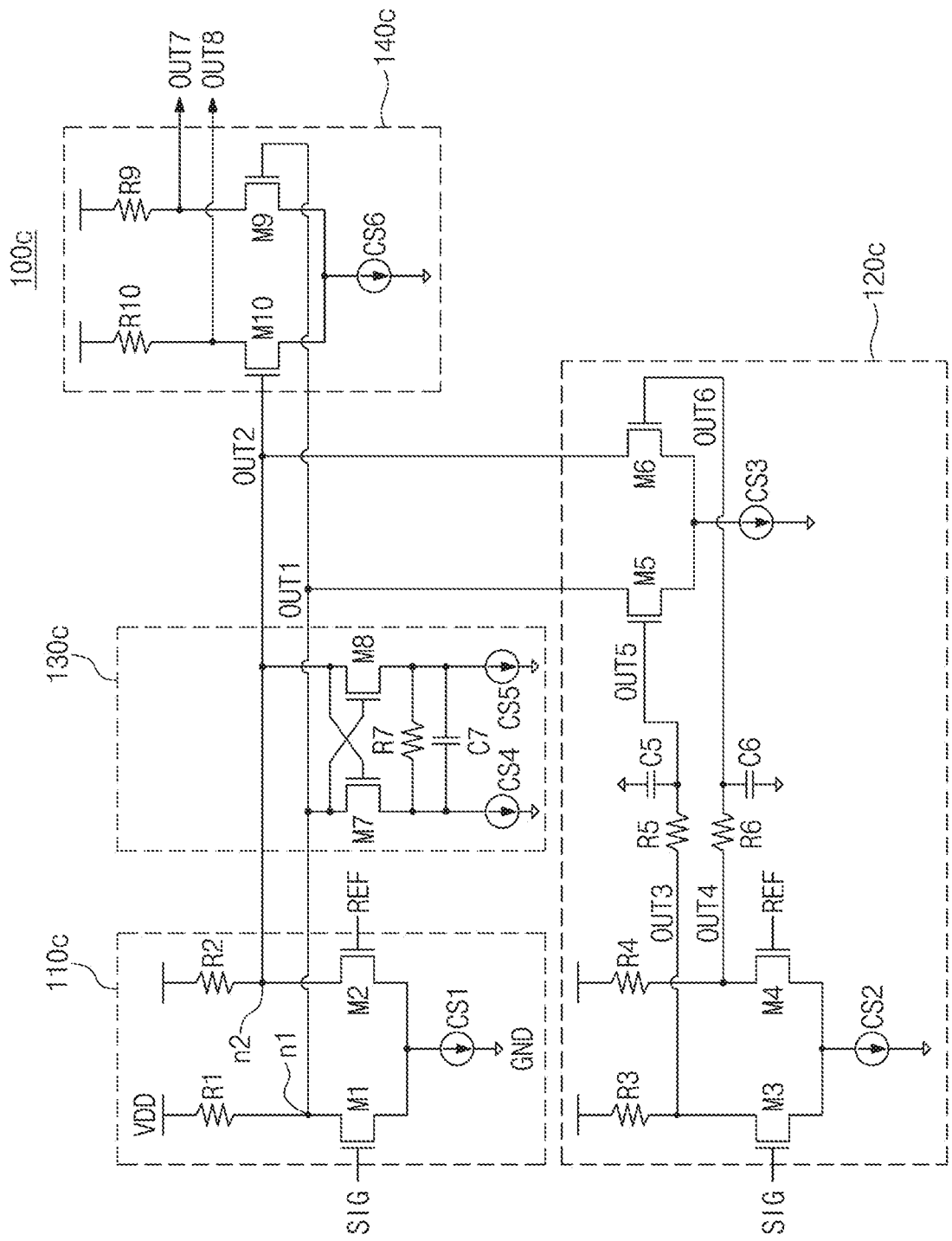
FIG. 4 illustrates a block diagram of a receiver of FIG. 1 according to another embodiment of the inventive concept.

FIG. 4 illustrates a block diagram of a receiver of FIG. 1 according to another embodiment of the inventive concept. A receiver 100c that is an example of the receiver 100 of FIG. 1 may include an amplifier 110c, an equalizer 120c, an equalizer 130c, and an amplifier 140c. Configurations and operations of the amplifier 110c, the equalizer 120c, and the equalizer 130c of FIG. 4 are substantially the same as the configurations and the operations of the amplifier 110b, the equalizer 120b, and the equalizer 130b of FIG. 3. A difference between the receiver 100c of FIG. 4 and the receiver 100b of FIG. 3 will be mainly described.

The amplifier 140c may include transistors M9 and M10, resistors R9 and R10, and a current source CS6. The amplifier 140c may compare the output signals OUT1 and OUT2, may amplify a voltage difference between the output signals OUT1 and OUT2, and may generate output signals OUT7 and OUT8. Because a gain of the amplifier 110c may be decreased by the equalizer 120c, the amplifier 140c may amplify the output signals OUT1 and OUT2 to compensate for the decreased gain of the amplifier 110c. In the case where the decreased gain of the amplifier 110c is sufficient, the receiver 100c may not include the amplifier 140c. A configuration and an operation of the amplifier 140c is similar to the configuration and the operation of the amplifier 110c or the amplifier in the equalizer 120c described above, with the exception that the input signals of the amplifier 140c are the output signals OUT1 and OUT2. In an embodiment, the receiver 100c may further include a CML2CMOS circuit (not illustrated) that receives the output signals OUT7 and OUT8 and generates a digital signal having a logic value of "0" and "1".

Figure 5:
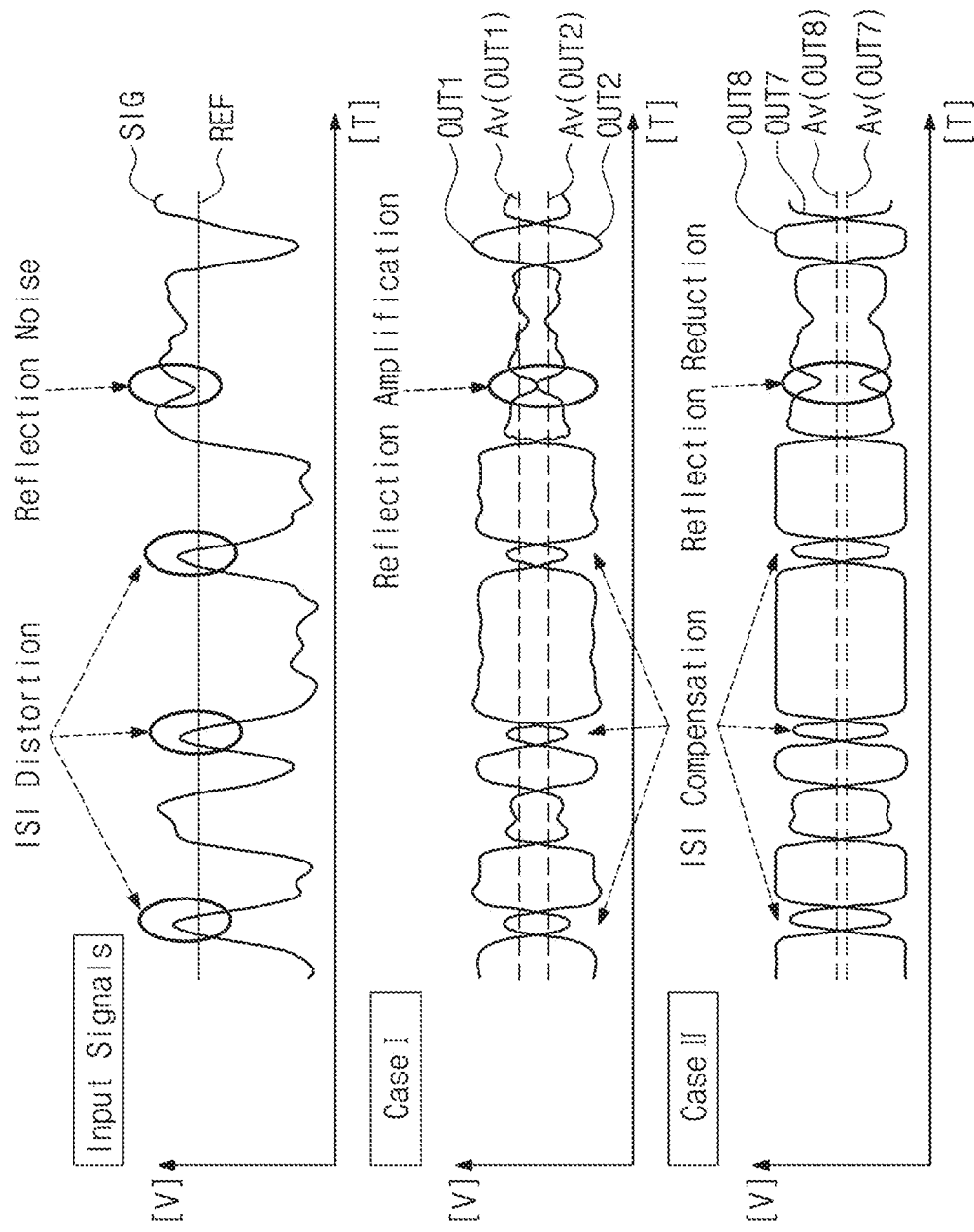
FIG. 5 is a timing diagram illustrating an operation of an equalizer of FIG. 4.

FIG. 5 is a timing diagram illustrating an operation of an equalizer of FIG. 4. In each of graphs illustrated in FIG. 5, a horizontal axis and a vertical axis represent a time and a voltage level, respectively. In FIG. 5, it is assumed that a voltage level of the reference signal REF is set to be relatively high, and ISI distortion and reflection noise occur in the transmission signal SIG. The receiver 100c may receive the transmission signal SIG illustrated in FIG. 5 and may recover the transmission signal SIG by using the reference signal REF. Referring to the timing of FIG. 5 at which the ISI distortion and the reflection noise occur, it may be observed that a voltage margin in which the receiver 100c is able to effectively detect the transmission signal SIG decreases relatively. A first case "Case I" of FIG. 5 indicates the case where the receiver 100c does not include the equalizer 120c. A second case "Case II" of FIG. 5 indicates the case where the receiver 100c includes the equalizer 120c.

Referring to the first case "CASE I", the receiver 100c may amplify the output signals OUT1 and OUT2 in a positive feedback manner such as a high-frequency component of the transmission signal SIG due to the ISI distortion is appropriately compensated or recovered. However, an example is illustrated in FIG. 5 as, in the case where the voltage margin decreases due to the reflection noise, the output signals OUT1 and OUT2 of the receiver 100c are flipped. The equalizer 130c may amplify the high-frequency component of the transmission signal SIG without distinguishing the ISI distortion and the reflection noise. However, the receiver 100c that does not include the equalizer 120c may fail to appropriately recover the high-frequency component of the transmission signal SIG due to the reflection noise. In the first case "CASE I", an average voltage level of the output signal OUT1 is "Av(OUT1)", and an average voltage level of the output signal OUT2 is "Av(OUT2)". A voltage difference between the average voltage levels Av(OUT1) and Av(OUT2) may correspond to a voltage difference between an average voltage level of the transmission signal SIG and a voltage level of the reference signal REF, which represents a common-mode offset. Because it is assumed in the first case "CASE I" that the receiver 100c does not include the equalizer 120c, the common-mode offset between the transmission signal SIG and the reference signal REF may appear as a common-mode offset between the output signals OUT1 and OUT2 (i.e., a voltage difference between the average voltage levels Av(OUT1) and Av(OUT2)).

Referring to the second case "CASE II", like the first case "CASE I", the equalizer 130c of the receiver 100c may amplify the output signals OUT1 and OUT2 in a positive feedback manner so that a high-frequency component of the transmission signal SIG, which is due to the ISI distortion, is appropriately compensated or recovered. Unlike the first case "CASE I", because the receiver 100c includes the equalizer 120c, the equalizer 120c may compensate the common-mode offset between the transmission signal SIG and the reference signal REF. A voltage difference between average voltage levels Av(OUT7) and Av(OUT8) of the output signals OUT7 and OUT8 may be decreased by the equalizer 120c to be smaller than the voltage difference between the average voltage levels Av(OUT1) and Av(OUT2) of the output signals OUT1 and OUT2 of the first case "CASE I". Unlike the first case "CASE I", the receiver 100c may appropriately recover the high-frequency component of the transmission signal SIG due to the reflection noise. The degree to which the output signals OUT7 and OUT8 are distorted due to the reflection noise may be decreased by the receiver 100c to be smaller than the degree to which the transmission signal SIG is distorted due to the reflection noise.

Figure 6:
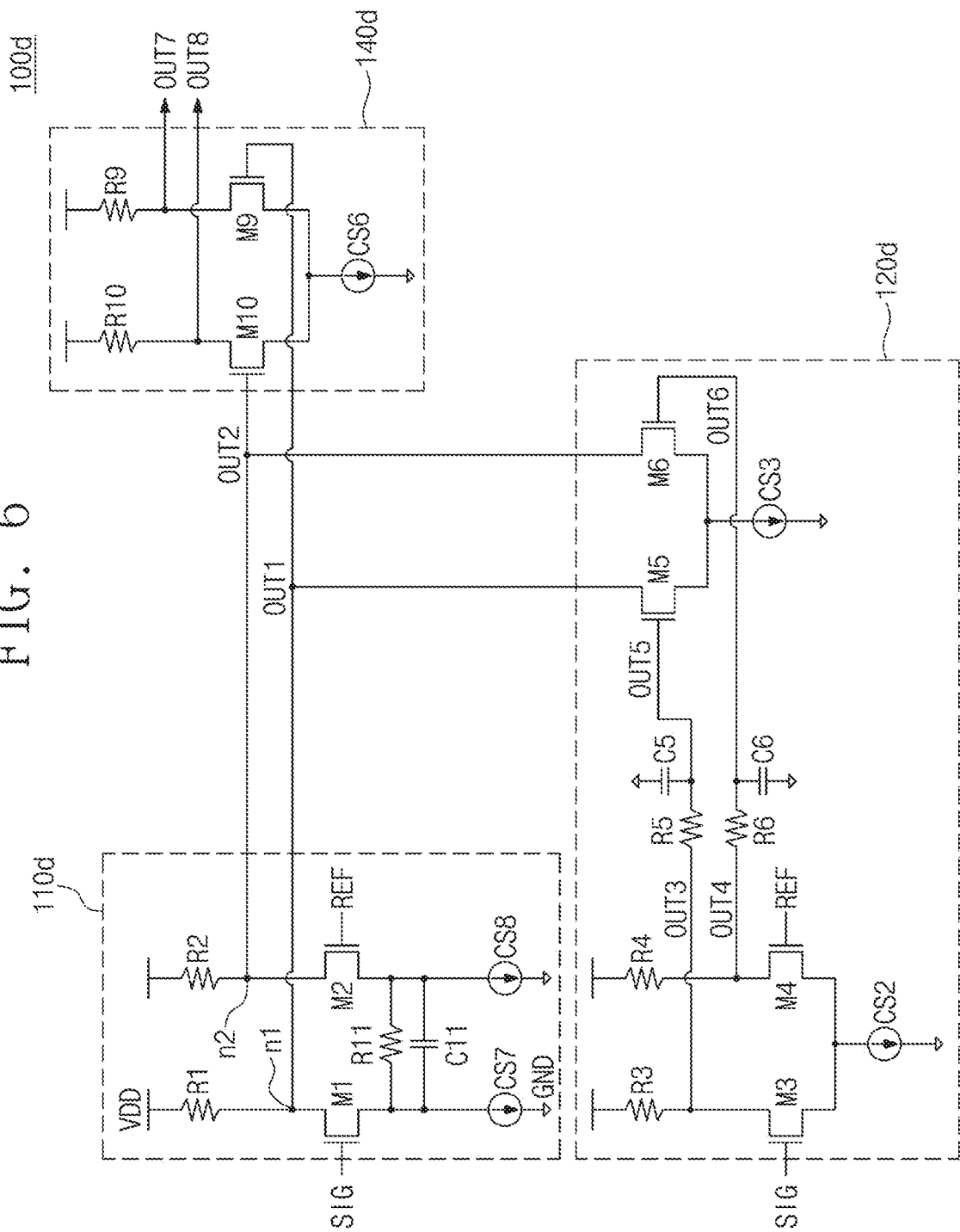
FIG. 6 illustrates a block diagram of a receiver of FIG. 1 according to another embodiment of the inventive concept.

FIG. 6 illustrates a block diagram of a receiver of FIG. 1 according to another embodiment of the inventive concept. A receiver 100d that is an example of the receiver 100 of FIG. 1 may include an amplifier 110d, an equalizer 120d, and an amplifier 140d. Configurations and operations of the equalizer 120d and the amplifier 140d of FIG. 6 are substantially the same as the configurations and the operations of the equalizer 120c and the amplifier 140c of FIG. 4. A difference between the receiver 100d of FIG. 6 and the receiver 100c of FIG. 4 will be mainly described.

The receiver 100d may not include the equalizer 130c of FIG. 4. Instead, the amplifier 110d may include transistors M1 and M2, resistors R1, R2, and R11, a capacitor C11, and current sources CS7 and CS8. Source terminals of the transistors M1 and M2 are not connected in common to the current source CS1. A source terminal of the transistor M1 may be connected to the current source CS7, a first end of the resistor R11, and a first end of the capacitor C11. A source terminal of the transistor M2 may be connected to the current source CS8, a second end of the resistor R11, and a second end of the capacitor C11. The current source CS7 may generate a bias current flowing through the transistor M1. The current source CS8 may generate a bias current flowing through the transistor M2. Each of the current sources CS7 and CS8 may be implemented with a transistor that has a gate terminal configured to receive a bias voltage, a drain terminal connected to the corresponding one of the transistors M1 and M2, and a source terminal connected to the power supply voltage GND.

As in the equalizer 130c, because the amplifier 110d includes the resistor R11 and the capacitor C11 connected in parallel between the source terminals of the transistors M1 and M2, the amplifier 110d may amplify, compensate, or recover a high-frequency component of the transmission signal SIG weakened due to the channel loss. The amplifier 110d may be a high pass filter that boosts the high-frequency component of the transmission signal SIG. At the same time, as in the amplifier 110c, the amplifier 110d may compare the transmission signal SIG with the reference signal REF, may amplify a voltage difference between the transmission signal SIG and the reference signal REF, and may generate the output signals OUT1 and OUT2 at the nodes n1 and n2. For example, the resistor R11 and the capacitor C11 may be referred to as a "source degeneration circuit". The amplifier 110d may be referred to as a "degenerated equalizer" or a "degenerated CTLE".

Figure 7:
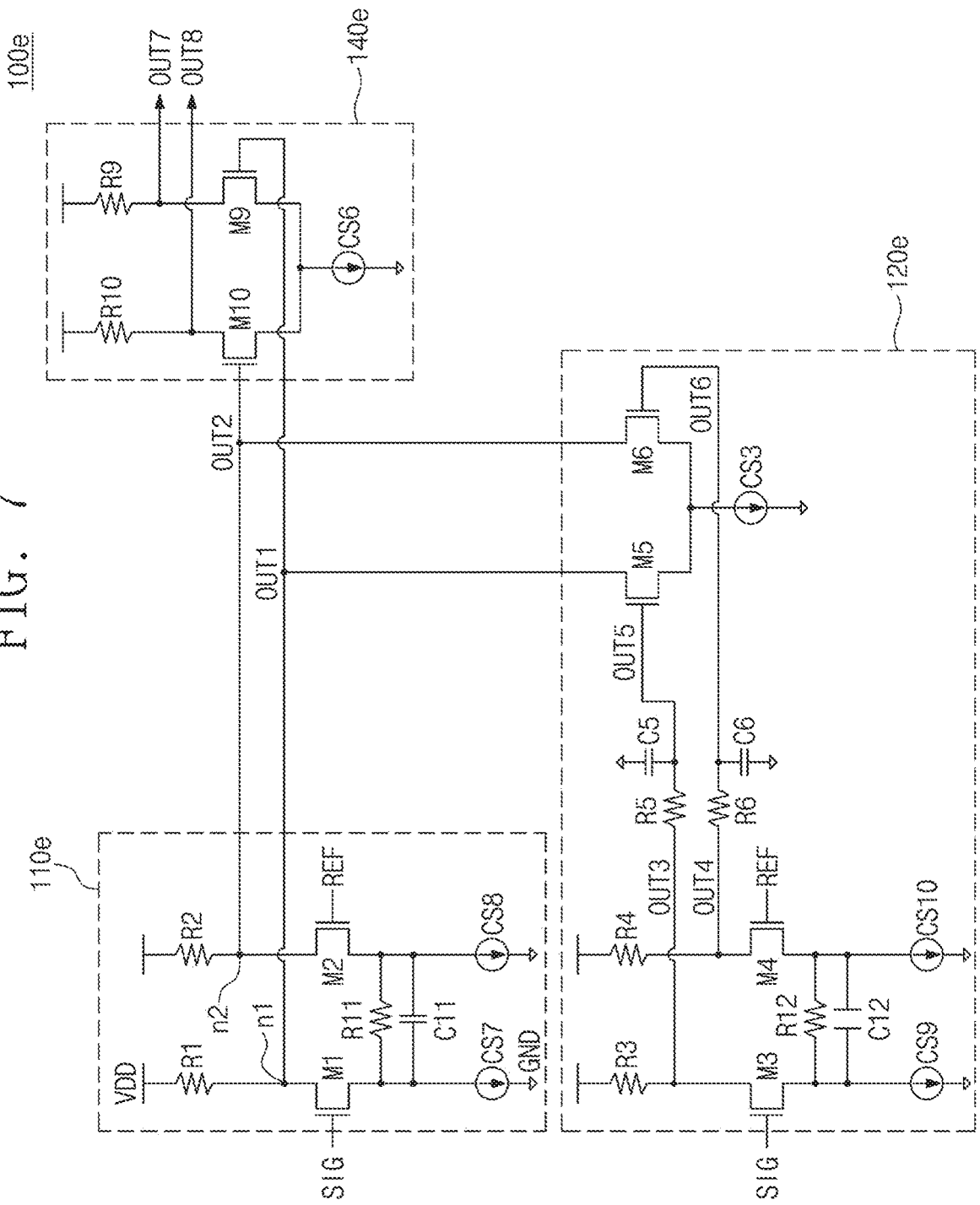
FIG. 7 illustrates a block diagram of a receiver of FIG. 1 according to another embodiment of the inventive concept.

FIG. 7 illustrates a block diagram of a receiver of FIG. 1 according to another embodiment of the inventive concept. A receiver 100e that is an example of the receiver 100 of FIG. 1 may include an amplifier 110e, an equalizer 120e, and an amplifier 140e. Configurations and operations of the amplifier 110e and the amplifier 140e of FIG. 7 are substantially the same as the configurations and the operations of the amplifier 110d and the amplifier 140d of FIG. 6. A difference between the receiver 100e of FIG. 7 and the receiver 100d of FIG. 6 will be mainly described.

An amplifier of the equalizer 120e may include transistors M3 and M4, resistor R3, R4, and R12, a capacitor C12, and current sources CS9 and CS10. Operations of the components M3, M4, R3, R4, R12, C12, CS9, and CS10 of the amplifier in the equalizer 120e may be substantially the same as the operations of the components M1, M2, R1, R2, R11, C11, CS7, and CS8 of the amplifier 110e. For example, the amplifier of the equalizer 120e that is a replica circuit of the amplifier 110e may be implemented to be substantially the same as the amplifier 110e.

Figure 8:
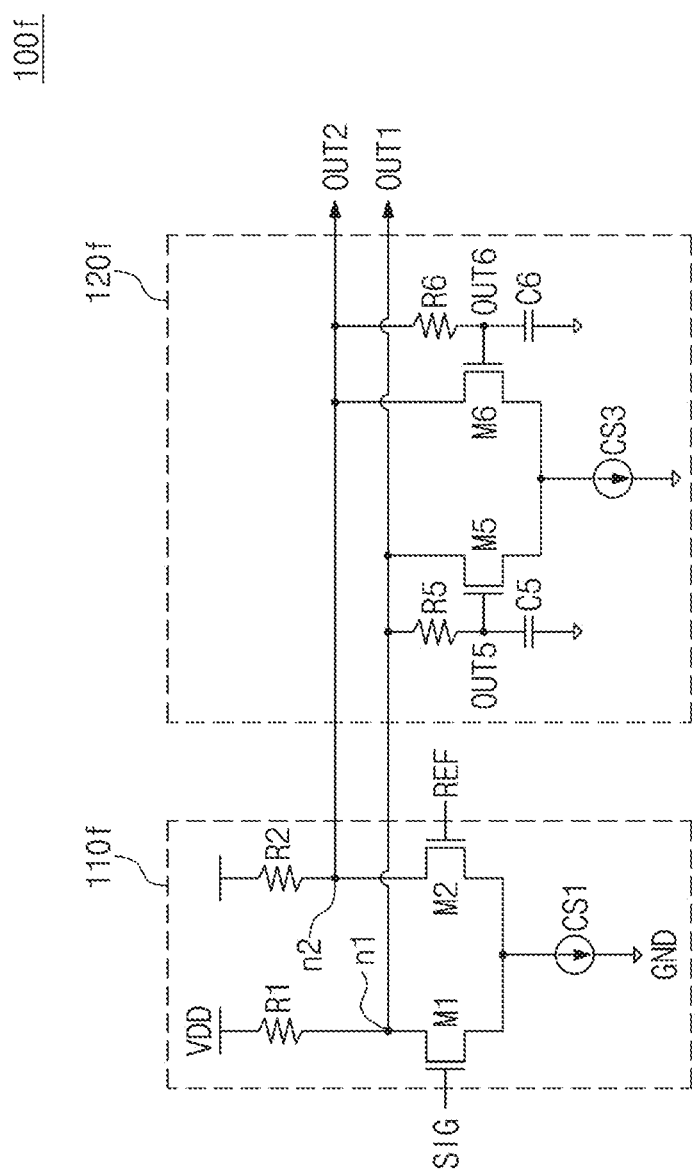
FIG. 8 illustrates a block diagram of a receiver of FIG. 1 according to another embodiment of the inventive concept.

FIG. 8 illustrates a block diagram of a receiver of FIG. 1 according to another embodiment of the inventive concept. A receiver 100f that is an example of the receiver 100 of FIG. 1 may include an amplifier 110f and an equalizer 120f. A configuration and an operation of the amplifier 110f of FIG. 8 is substantially the same as the configuration and the operation of the amplifier 110a of FIG. 2. A difference between the receiver 100f of FIG. 8 and the receiver 100a of FIG. 2 will be mainly described. Unlike the receiver 100a of FIG. 2, the receiver 100f of FIG. 8 may include a feedback path that is implemented with resistors R5 and R6 and capacitors C5 and C6.

The equalizer 120f may include transistors M5 and M6, the current source CS3, resistors R5 and R6, and the capacitors C5 and C6. The equalizer 120f may not include the transistors M3 and M4, the resistors R3 and R4, and the current source CS2 of the equalizer 120a of FIG. 2. The resistor R5 and the capacitor C5 may be configured as a low pass filter that filters the output signal OUT1 and generates the output signal OUT5. The resistor R6 and the capacitor C6 may be configured as a low pass filter that filters the output signal OUT2 and generates the output signal OUT6. A switching, a toggling, or a transition of the transmission signal SIG may be reflected in the output signals OUT1 and OUT2. The output signals OUT1 and OUT2 may be switched at a transmission speed of the transmission signal SIG by the amplifier 110f. The low pass filters (R5, C5) and (R6, C6) may filter high-frequency components of the output signals OUT1 and OUT2. The output signals OUT5 and OUT6 may be similar to a DC signal. A voltage level of the output signal OUT5 may be an average voltage level of the output signal OUT1. A voltage level of the output signal OUT6 may be an average voltage level of the output signal OUT2.

Comparing the equalizer 120a of FIG. 2 with the equalizer 120f of FIG. 8, a filtering circuit of the equalizer 120f may filter the output signals OUT1 and OUT2 and may generate the output signals OUT5 and OUT6, and a filtering circuit of the equalizer 120a may filter the output signals OUT3 and OUT4 of the amplifier in the equalizer 120a being a replica circuit, and may generate the output signals OUT5 and OUT6. Operations of the components M5, M6, CS3, R5, R6, C5, and C6 of the equalizer 120f may be substantially the same as the operations of the components M5, M6, CS3, R5, R6, C5, and C6 of the amplifier 110a, except for the above-specified difference.

The equalizer 120a may compensate for a common-mode offset. When a common-mode offset occurs between the transmission signal SIG and the reference signal REF, a voltage difference (i.e., a common-mode offset) may occur between average voltage levels of the output signals OUT1 and OUT2 of the amplifier 110f. A voltage difference (i.e., a common-mode offset) may occur between voltage levels of the output signals OUT5 and OUT6. The common-mode offset between the output signals OUT1 and OUT2 and the common-mode offset between the output signals OUT5 and OUT6 all may occur due to the common-mode offset between the transmission signal SIG and the reference signal REF.

A current adjusting circuit (M5, M6, CS3) of the equalizer 120f may compensate the common-mode offset between the output signals OUT1 and OUT2, based on the common-mode offset between the transmission signal SIG and the reference signal REF. Depending on the output signal OUT5, the transistor M5 may adjust or sink a current from the node n1, may adjust the amount of current flowing from the node n1 to the power supply voltage GND, and may adjust a voltage level of the output signal OUT1. Depending on the output signal OUT6, the transistor M6 may adjust or sink a current from the node n2, may adjust the amount of current flowing from the node n2 to the power supply voltage GND, and may adjust a voltage level of the output signal OUT2. Because the equalizer 120f filters the output signals OUT1 and OUT2 and generates the output signals OUT5 and OUT6, and adjusts voltage levels of the output signals OUT1 and OUT2 based on the output signals OUT5 and OUT6, the output signals OUT5 and OUT6 may be referred to as "feedback signals".

It is assumed that an average voltage level of the transmission signal SIG is higher than a voltage level of the reference signal REF. An average voltage level of the output signal OUT1 may be lower than an average voltage level of the output signal OUT2. A voltage level of the output signal OUT5 is lower than a voltage level of the output signal OUT6. The amount of current flowing through the transistor M5 depending on the output signal OUT5 is smaller than the amount of current flowing through the transistor M6 depending on the output signal OUT6. A magnitude by which a voltage level of the output signal OUT1 is decreased (or adjusted) by the transistor M5 is smaller than a magnitude by which a voltage level of the output signal OUT2 is decreased (or adjusted) by the transistor M6. In the above manner, the transistors M5 and M6 of the equalizer 120f may adjust the amounts of current flowing through the transistors M5 and M6 in order to remove or decrease a voltage difference between average voltage levels of the output signals OUT1 and OUT2 due to the common-mode offset between the transmission signal SIG and the reference signal REF. Advantageously, the common-mode offset between the output signals OUT1 and OUT2, which occurs due to the common-mode offset between the transmission signal SIG and the reference signal REF, may be compensated, removed, decreased, or suppressed by the equalizer 120f. The equalizer 120f may be referred to as a "common-mode offset compensation circuit".

Figure 9:
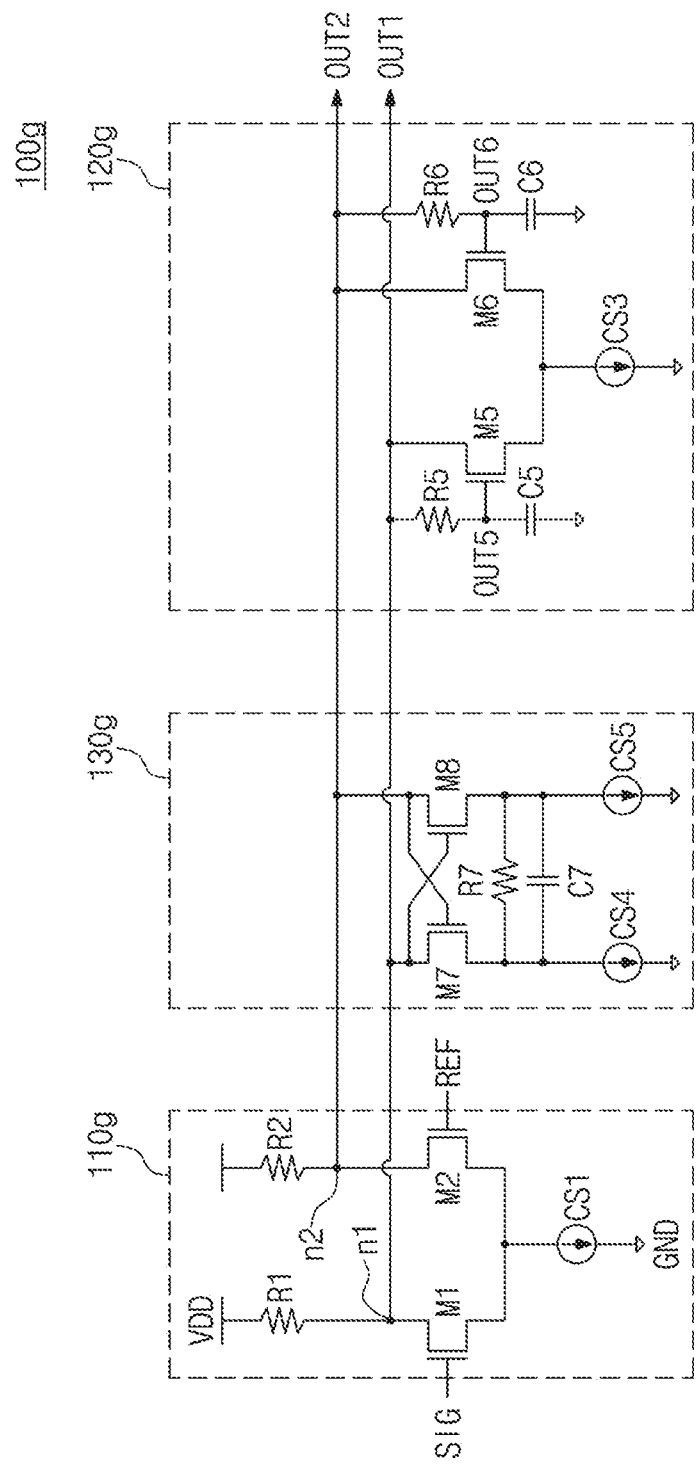
FIG. 9 illustrates a block diagram of a receiver of FIG. 1 according to another embodiment of the inventive concept.

FIG. 9 illustrates a block diagram of a receiver of FIG. 1, according to another embodiment of the inventive concept. A receiver 100g that is an example of the receiver 100 of FIG. 1 may include an amplifier 110g, an equalizer 120g, and an equalizer 130g. Configurations and operations of the amplifier 110g and the equalizer 120g of FIG. 9 are substantially the same as the configurations and the operations of the amplifier 110f and the equalizer 120f of FIG. 8. A configuration and an operation of the equalizer 130g of FIG. 9 is substantially the same as the configuration and the operation of the equalizer 130b of FIG. 3.

Figure 10:
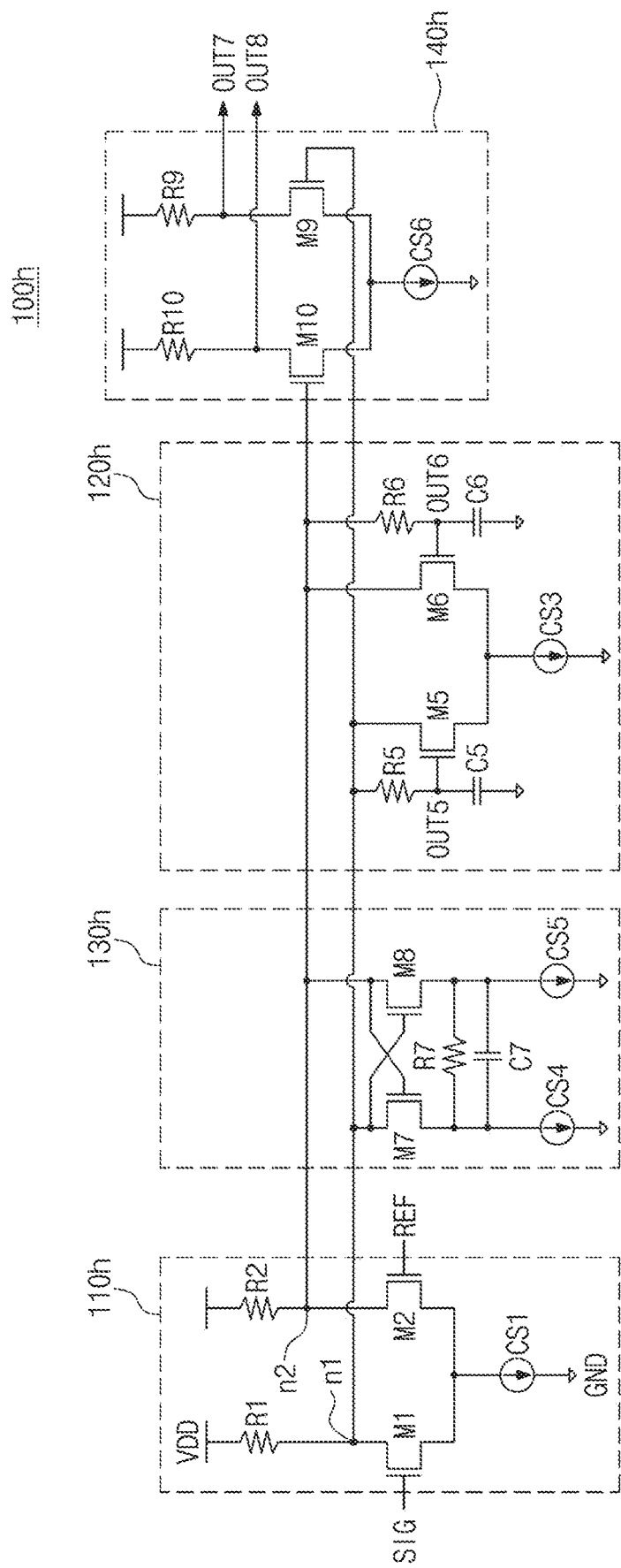
FIG. 10 illustrates a block diagram of a receiver of FIG. 1 according to another embodiment of the inventive concept.

FIG. 10 illustrates a block diagram of a receiver of FIG. 1 according to another embodiment of the inventive concept. A receiver 100h that is an example of the receiver 100 of FIG. 1, may include an amplifier 110h, an equalizer 120h, an equalizer 130h, and an amplifier 140h. Configurations and operations of the amplifier 110h, the equalizer 120h, and the equalizer 130h of FIG. 10 are substantially the same as the configurations and the operations of the amplifier 110g, the equalizer 120g, and the equalizer 130g of FIG. 9. A configuration and an operation of the amplifier 140h of FIG. 10 is substantially the same as the configuration and the operation of the amplifier 140c of FIG. 4.

Figure 11:
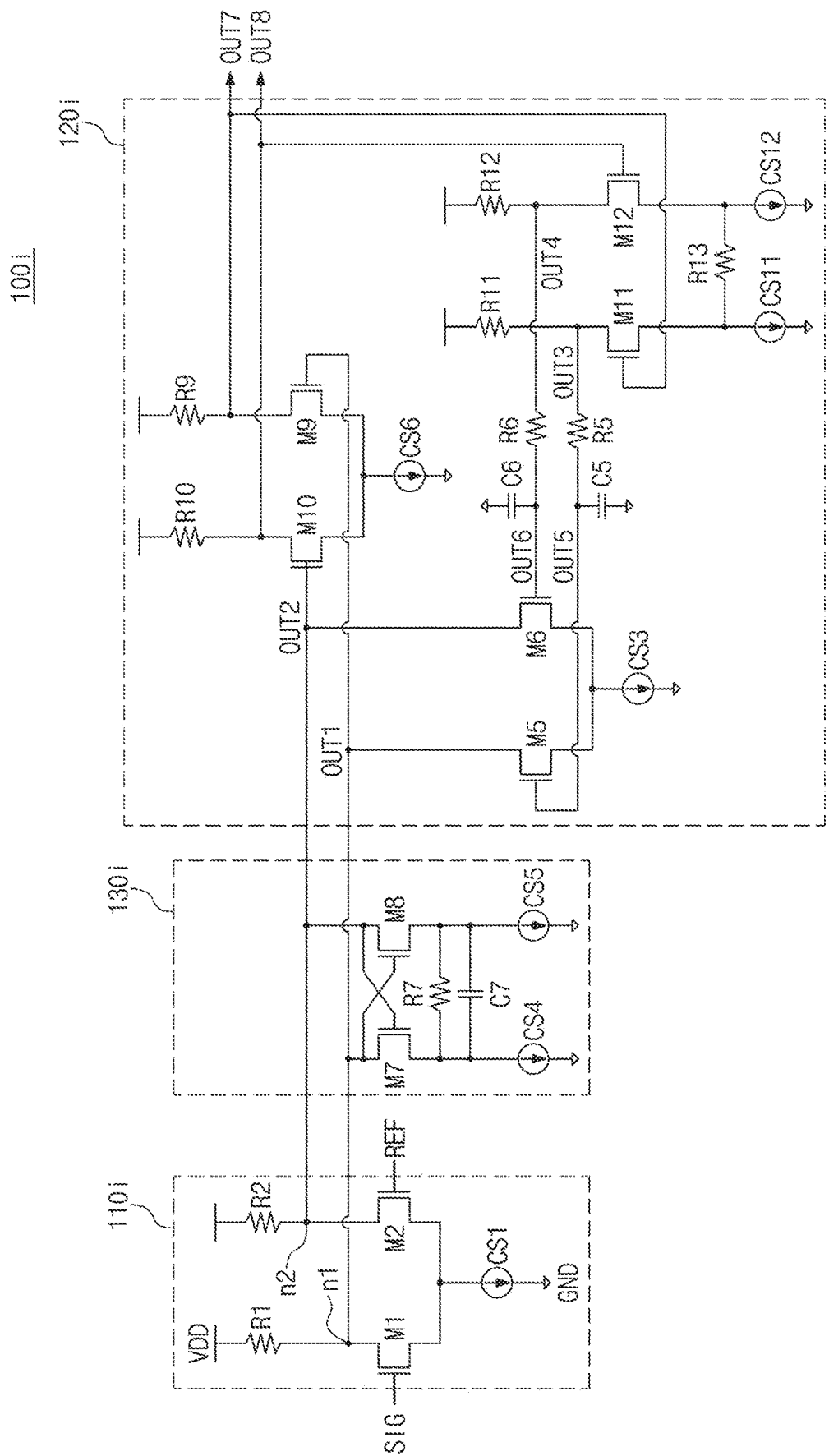
FIG. 11 illustrates a block diagram of a receiver of FIG. 1 according to another embodiment of the inventive concept.

FIG. 11 illustrates a block diagram of a receiver of FIG. 1 according to another embodiment of the inventive concept. A receiver 100i that is an example of the receiver 100 of FIG. 1 may include an amplifier 110i, an equalizer 120i, and an equalizer 130i. Configurations and operations of the amplifier 110i and the equalizer 130i of FIG. 11 are substantially the same as the configurations and the operations of the amplifier 110h and the equalizer 130h of FIG. 10. A difference between the receiver 100i of FIG. 11 and the receiver 100h of FIG. 10 will be mainly described.

The equalizer 120i may include transistors M9 and M10, resistors R9 and R10, and the current source CS6. A configuration and operations of the transistors M9 and M10, the resistors R9 and R10, and the current source CS6 of FIG. 11 is substantially the same as the configuration and the operations given with reference to the amplifier 140h of FIG. 10.

The equalizer 120i may further include transistors M11 and M12, resistor R11, R12, and R13, and current sources CS11 and CS12. Operations of the transistors M11 and M12, the resistors R12 and R13, and the current sources CS11 and CS12 of FIG. 11 are similar to the operations given with reference to the amplifier 110d of FIG. 6. Although not illustrated in FIG. 11, as in the amplifier 110d of FIG. 6, the equalizer 120i may further include the capacitor C11. An amplifier that includes the transistors M11 and M12, the resistors R11, R12, and R13, and the current sources CS11 and CS12 may compare the output signals OUT7 and OUT8, may amplify the voltage difference between the output signals OUT7 and OUT8, and may generate the output signals OUT3 and OUT4.

The equalizer 120i may include the resistors R5 and R6, the capacitors C5 and C6, the transistors M5 and M6, and the current source CS3. The resistor R5 and the capacitor C5 may operates as a low pass filter that filters the output signal OUT3 and generates the output signal OUT5. The resistor R6 and the capacitor C6 may operate as a low pass filter that filters the output signal OUT4 and generates the output signal OUT6. The low pass filters may be referred to as a "filtering circuit".

Comparing the equalizer 120f of FIG. 8 with the equalizer 120i of FIG. 11, the filtering circuit of the equalizer 120i of FIG. 11 may filter the output signals OUT3 and OUT4 and may generate the output signals OUT5 and OUT6, and the filtering circuit of the equalizer 120f of FIG. 8 may filter the output signals OUT1 and OUT2 and may generate the output signals OUT5 and OUT6. Operations of the components M5, M6, CS3, R5, R6, C5, and C6 of the equalizer 120i may be substantially the same as the operations of the components M5, M6, CS3, R5, R6, C5, and C6 of the equalizer 120f, except for the above difference. Referring to FIG. 8, only the filtering circuit may provide feedback paths. In contrast, referring to FIG. 11, as well as the filtering circuit, the transistors M9 to M11, the resistors R9 to R13, and the current sources CS6, CS11, and CS12 may form feedback paths.

Figure 12:
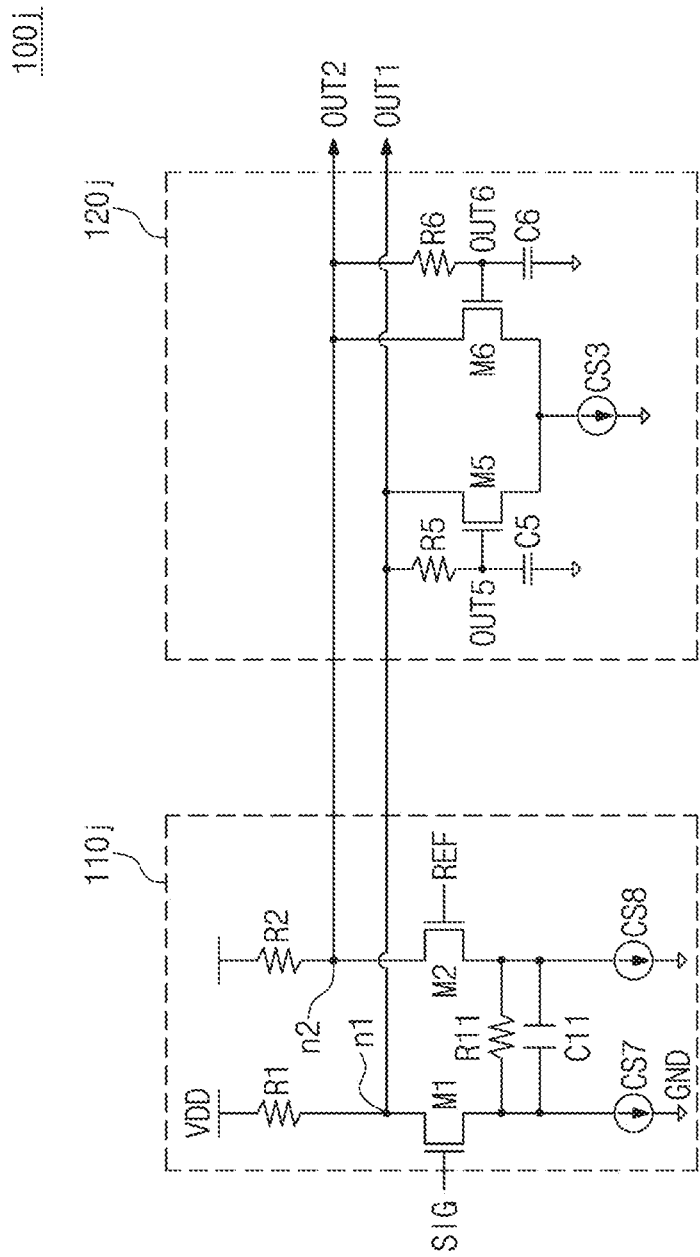
FIG. 12 illustrates a block diagram of a receiver of FIG. 1 according to another embodiment of the inventive concept.

FIG. 12 illustrates a block diagram of a receiver of FIG. 1 according to another embodiment of the inventive concept. A receiver 100j that is an example of the receiver 100 of FIG. 1 may include an amplifier 110j and an equalizer 120j. A configuration and an operation of the amplifier 110j of FIG. 12 is substantially the same as the configuration and the operation of the amplifier 110d of FIG. 6. A configuration and an operation of the equalizer 120j of FIG. 12 is substantially the same as the configuration and the operation of the equalizer 120f of FIG. 8. In an embodiment, the amplifier 110j of FIG. 12 may be used instead of the amplifiers 110f, 110g, 110h, and 110i of FIGS. 8 to 11. In an embodiment, as in the receiver 100h of FIG. 10, the receiver 100j may further include the amplifier 140h. In an embodiment, the receiver 100j may include the equalizer 120i of FIG. 11 instead of the equalizer 120j.

Figure 13:
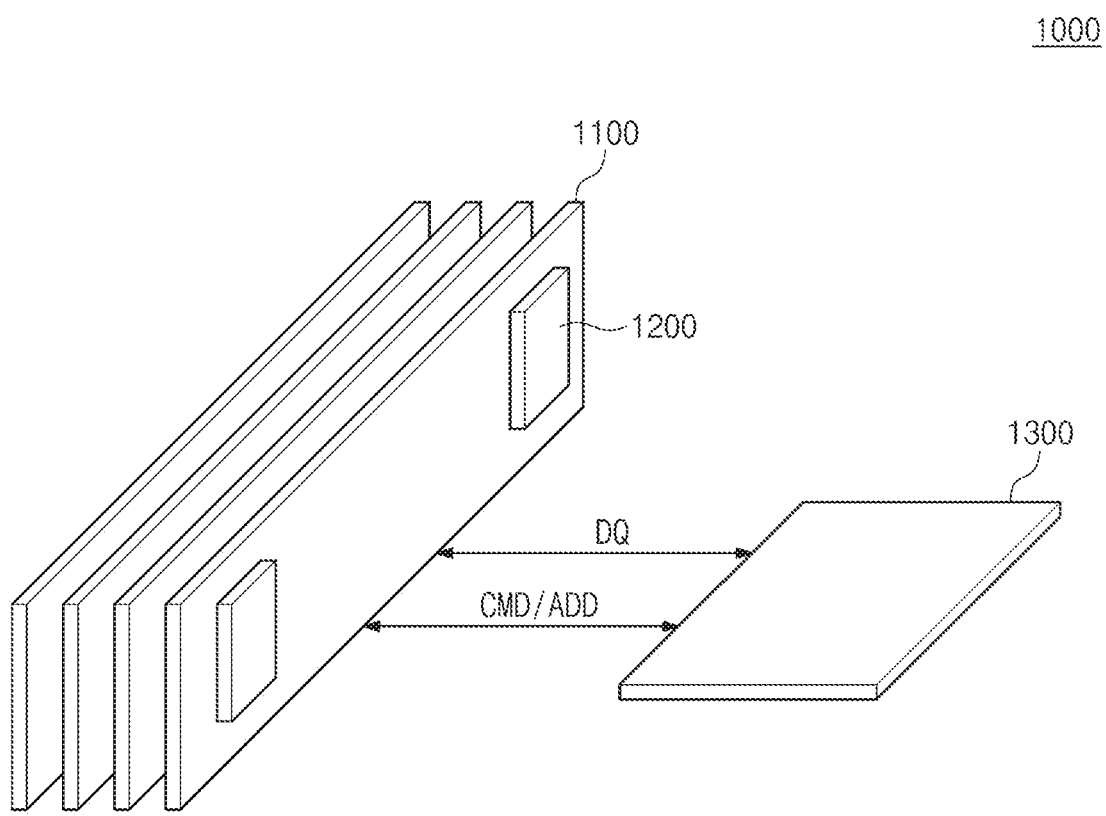
FIG. 13 illustrates an electronic device to which a receiver according to an embodiment of the inventive concept is applied.

FIG. 13 illustrates an electronic device to which a receiver according to an embodiment of the inventive concept is applied. An electronic device 1000 may be referred to as a "computing system", a "memory system", an "electronic system", or a "communication system". The electronic device 1000 may include a memory module 1100 and a memory controller 1300. Although not illustrated in FIG. 13, the electronic device 1000 may further include a board on which the memory module 1100 and the memory controller 1300 are disposed, and a socket on which the memory module 1100 is mounted.

The memory module 1100 may include a memory device 1200. In the electronic device 1000, the number of memory modules 1100 and the number of memory devices attached to one memory module 1100 are not limited to the example of FIG. 13. The memory module 1100 may be a dual in-line memory module (DIMM) that complies with the JEDEC (Joint Electron Device Engineering Council) standard. The memory module 1100 may be a registered DIMM (RDIMM), a load reduced DIMM (LRDIMM), an unbuffered DIMM (UDIMM), a fully buffered DIMM (FB-DIMM), a small outline DIMM (SO-DIMM), or any other memory module (e.g., a single in-line memory module (SIMM)).

The memory device 1200 may be various DRAM devices such as a double data rate synchronous dynamic random access memory (DDR SDRAM), DDR2 SDRAM, DDR3 SDRAM, DDR4 SDRAM, DDR5 SDRAM, a low power double data rate (LPDDR) SDRAM, LPDDR2 SDRAM, LPDDR3 SDRAM, LPDDR4 SDRAM, LPDDR4X SDRAM, LPDDR5 SDRAM, a graphics double data rate synchronous graphics random access memory (GDDR SGRAM), GDDR2 SGRAM, GDDR3 SGRAM, GDDR4 SGRAM, GDDR5 SGRAM, GDDR6 SGRAM, etc. The memory device 1200 may be a memory device, in which DRAM dies are stacked, such as a high bandwidth memory (HBM), HBM2, HBM3, etc. The memory device 1200 may include a static random access memory (SRAM) device, a thyristor RAM (TRAM) device, a NAND flash memory device, a NOR flash memory device, a resistive RAM (RRAM), a ferroelectric RAM (FRAM), a phase change RAM (PRAM), a magnetic RAM (MRAM), etc. The types of memory device 1200 are not limited to the above listed types, and the memory device 1200 may include any suitable device capable of storing data.

A plurality of paths through which command/address signals CMD/ADD and data input/output signals DQ are transmitted may be interposed between the memory module 1100 and the memory controller 1300. The plurality of paths may correspond to the channel 12 of FIG. 1.

The memory device 1200 may include at least one of the receivers 100a to 100j described with reference to FIGS. 2 to 12. The memory device 1200 may receive the command/address signals CMD/ADD transmitted through the plurality of paths from the memory controller 1300 by using at least one of the receivers 100a to 100j. The memory device 1200 may receive the data input/output signals DQ transmitted through the plurality of paths from the memory controller 1300 by using at least one of the receivers 100a to 100j. The data input/output signals DQ may be bidirectional signals, and the memory device 1200 may transmit the data input/output signals DQ to the memory controller 1300 through the plurality of paths.

The memory controller 1300 may also include at least one of the receivers 100a to 100j described with reference to FIGS. 2 to 12. The memory controller 1300 may receive the data input/output signals DQ transmitted through the plurality of paths from the memory device 1200 by using at least one of the receivers 100a to 100j.

Figure 14:
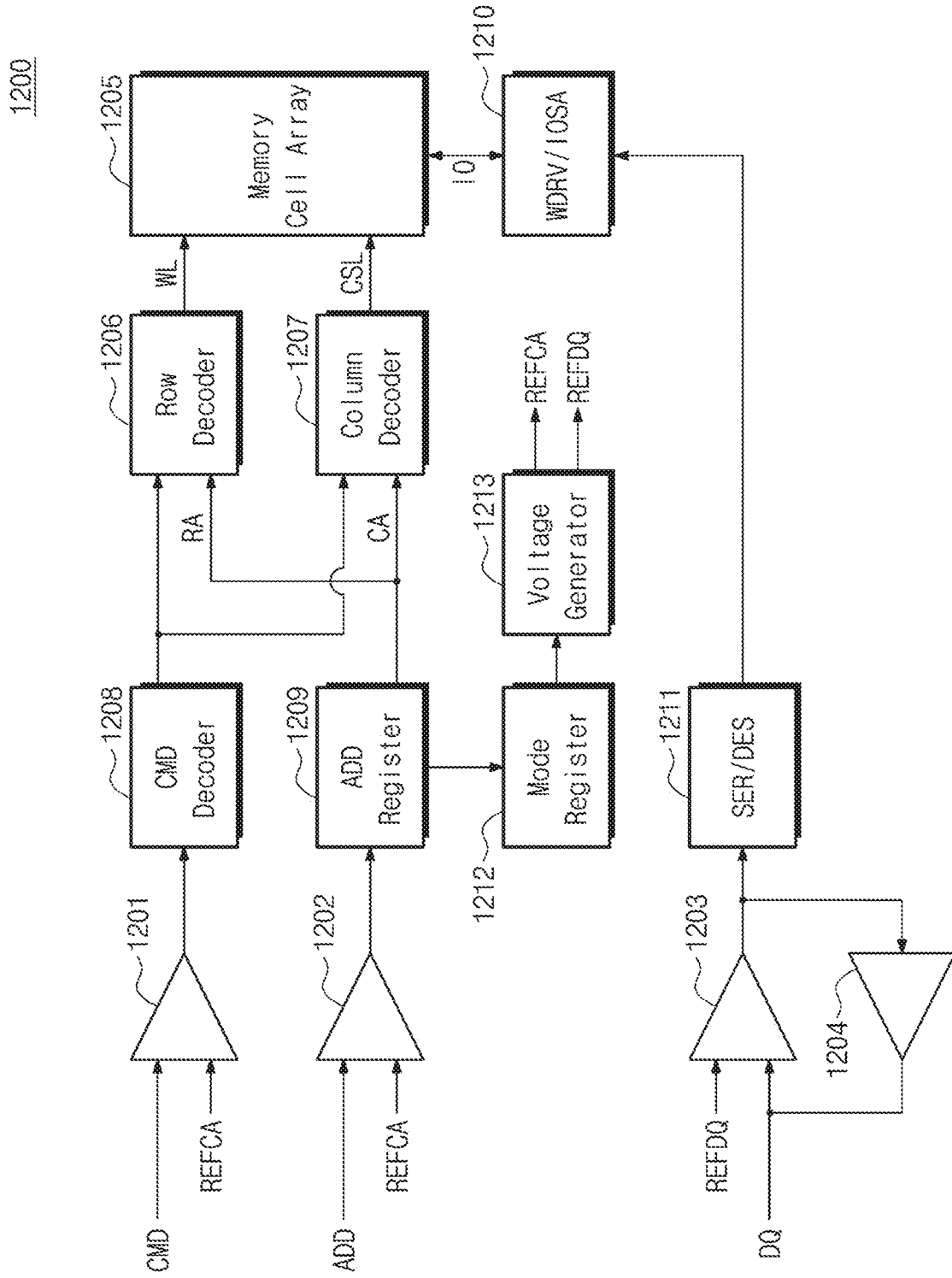
FIG. 14 illustrates a block diagram of a memory device of FIG. 13.

FIG. 14 illustrates a block diagram of a memory device of FIG. 13. The memory device 1200 may include receivers 1201 to 1203, a transmitter 1204, a memory cell array 1205, a row decoder 1206, a column decoder 1207, a command decoder 1208, an address register 1209, a write driver and input/output sense amplifier 1210, a serializer/deserializer 1211, a mode register 1212, and a voltage generator 1213.

The receiver 1201 may receive a command signal CMD and may compare the command signal CMD and a reference signal REFCA to detect the command signal CMD effectively. The receiver 1202 may receive an address signal ADD and may compare the address signal ADD and the reference signal REFCA to detect the address signal ADD effectively. The receiver 1201 may be referred to as a "command buffer", and the receiver 1202 may be referred to as an "address buffer". Each of the receivers 1201 and 1202 may be any one of the receivers 100a to 100j described with reference to FIGS. 2 to 12. Each of the command signal CMD and the address signal ADD may be generated by the memory controller 1300 and may correspond to the transmission signal SIG described with reference to FIGS. 2 to 12. The number of the receivers 1201 and 1202 is not limited to the example of FIG. 14 and may be determined in compliance with the JEDEC standard. The reference signal REFCA may correspond to the reference signal REF described with reference to FIGS. 2 to 12. Unlike the example of FIG. 14, the reference signal REFCA provided to the receiver 1201 and the reference signal REFCA provided to the receiver 1202 may be different.

The receiver 1203 may receive a data input/output signal DQ and may compare the data input/output signal DQ and a reference signal REFDQ to detect the data input/output signal DQ effectively. The receiver 1203 may be any one of the receivers 100a to 100j described with reference to FIGS. 2 to 12. The data input/output signal DQ may be generated by the memory controller 1300 and may correspond to the transmission signal SIG described with reference to FIGS. 2 to 12. The data input/output signal DQ may include bits of write data that the memory controller 1300 intends to store in the memory device 1200. The number of receivers 1203 is not limited to the example of FIG. 14 and may be determined in compliance with the JEDEC standard. The reference signal REFDQ may correspond to the reference signal REF described with reference to FIGS. 2 to 12.

The transmitter 1204 may transmit the data input/output signal DQ to the memory controller 1300. The data input/output signal DQ output by the transmitter 1204 may include bits of read data stored in the memory device 1200. The transmitter 1204 and the receiver 1203 may constitute a data input/output buffer.

The memory cell array 1205 may include memory cells connected to word lines WL and bit lines (not illustrated). For example, a memory cell may be any one of a DRAM cell, an SRAM cell, a TRAM cell, a NAND flash memory cell, a NOR flash memory cell, an RRAM cell, an FRAM cell, a PRAM cell, an MRAM cell, etc. Under control of the command decoder 1208, the row decoder 1206 may decode a row address RA and may activate the word line WL corresponding to the decoded row address RA. Under control of the command decoder 1208, the column decoder 1207 may decode a column address CA and may activate a column select line CSL corresponding to the decoded column address CA. One or more bit lines BL may be connected to the column select line CSL. Memory cells corresponding to the row address RA and the column address CA may be selected, and a data input/output operation may be performed on the selected memory cells.

The command decoder 1208 may receive and decode the command CMD (e.g., an active command, a write command, a read command, a precharge command, a mode register set command, or a multi-purpose command) generated by the memory controller 1300 from the receiver 1201. The command decoder 1208 may control the components of the memory device 1200. Under control of the command decoder 1208, the address register 1209 may receive the address ADD generated by the memory controller 1300 from the receiver 1202 and may provide the address ADD to the components of the memory device 1200. The address register 1209 may provide the received address ADD as the row address RA to the row decoder 1206. The address register 1209 may provide the received address ADD as the column address CA to the column decoder 1207. The address register 1209 may provide the received address ADD to the mode register 1212 as a code being an operation code OPCODE or an operand.

The write driver and input/output sense amplifier 1210 may include a write driver WDRV and an input/output sense amplifier IOSA. The write driver WDRV may receive write data from a deserializer DES of the serializer/deserializer 1211 and may write the write data to selected memory cells through an input/output line IO under control of the command decoder 1208. The input/output sense amplifier IOSA may sense data output from the selected memory cells through the input/output line IO and may provide the read data to a serializer SER of the serializer/deserializer 1211. The serializer/deserializer 1211 may include the serializer SER and the deserializer DES. The serializer SER may store read data in an internal buffer (e.g., a first-in first-out (FIFO)), may serialize bits of the read data, and may provide the serialized bits to the transmitter 1204. The deserializer DES may store write data in an internal buffer, may deserialize bits of the write data, and may provide the deserialized bits to the write driver WDRV.

The mode register 1212 may store the code provided from the address register 1209 under control of the command decoder 1208. The number of mode registers 1212, the size of a code, etc. may be defined in the JEDEC standard. The memory controller 1300 may transmit the address ADD including the mode register set command and the code to the memory device 1200, may change a code stored in the mode register 1212, and may set an operating condition, an operating mode, etc. of the memory device 1200.

The voltage generator 1213 may generate the reference signals REFCA and REFDQ that are provided to the receivers 1201 to 1203. The voltage generator 1213 may determine voltage levels of the reference signals REFCA and REFDQ based on a value of the code stored in the mode register 1212. For example, the voltage generator 1213 may include a resistor string digital to analog converter (DAC). The voltage levels of the reference signals REFCA and REFDQ may be changed depending on an operating condition, a test (e.g., RMT) condition, a PVT variation, etc. associated with the memory device 1200. The voltage generator 1213 may generate bias voltages that are provided to a plurality of current sources included in the receivers 100a to 100j described with reference to FIGS. 2 to 13.

Figure 15:
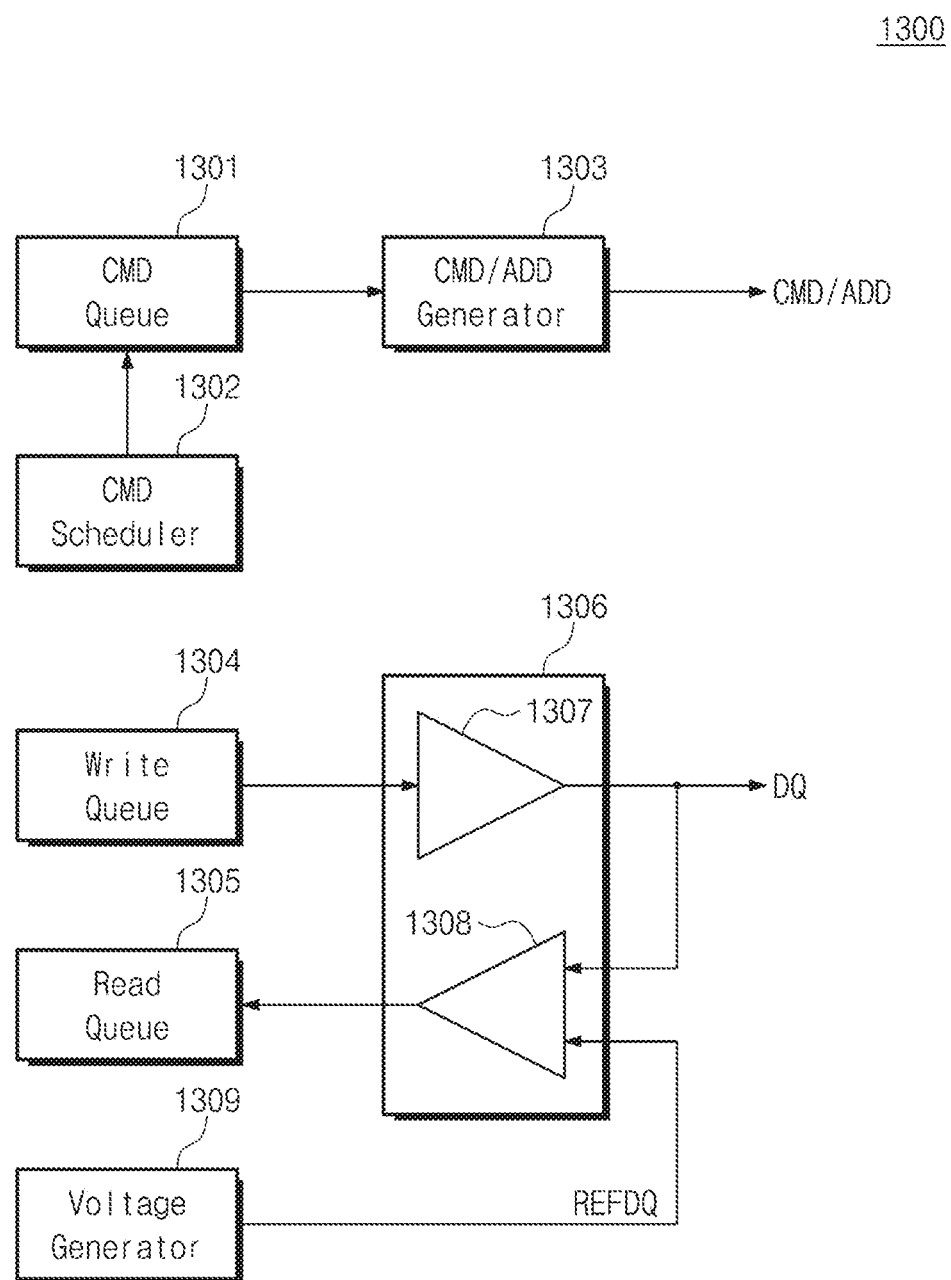
FIG. 15 illustrates a block diagram of a memory controller of FIG. 13.

FIG. 15 illustrates a block diagram of a memory controller of FIG. 13. The memory controller 1300 may include a command queue 1301, a command scheduler 1302, a command/address generator 1303, a write data queue 1304, a read data queue 1305, a data input/output buffer 1306, and a voltage generator 1309.

The command queue 1301 may store commands and addresses that are generated by a processor executing a variety of software (e.g., an application program, an operating system, a file system, and a device driver). The processor may be included in an integrated circuit in which the memory controller 1300 is implemented or may be implemented with a separate integrated circuit. The command queue 1301 may provide a command and an address to the command/address generator 1303 under control of the command scheduler 1302. The command scheduler 1302 may adjust an order of commands and addresses stored in the command queue 1301, a time when a command and an address are input to the command queue 1301, a time when a command and an address are output from the command queue 1301, etc. The command/address generator 1303 may receive a command or an address from the command queue 1301 and may transmit the command or the address to the memory device 1200. The command/address generator 1303 may include a plurality of transmitters that transmit command signals and address signals through physical paths between the memory controller 1300 and the memory device 1200.

The write data queue 1304 may store write data that are processed by the processor and are to be stored to the memory device 1200. The read data queue 1305 may store read data transmitted from the memory device 1200 through the data input/output buffer 1306. The data input/output buffer 1306 may include a transmitter 1307 and a receiver 1308. The number of data input/output buffers 1306 is not limited to the example of FIG. 15 and may be determined in compliance with the JEDEC standard. The transmitter 1307 may receive write data from the write data queue 1304 and may transmit the data input/output signal DQ including the write data to the memory device 1200.

The receiver 1308 may receive a data input/output signal DQ and may compare the data input/output signal DQ and a reference signal REFDQ to detect the data input/output signal DQ effectively. The receiver 1308 may be any one of the receivers 100a to 100j described with reference to FIGS. 2 to 12. The data input/output signal DQ may be generated by the memory device 1200 and may correspond to the transmission signal SIG described with reference to FIGS. 2 to 12. The data input/output signal DQ may include bits of read data output from the memory device 1200. The reference signal REFDQ may correspond to the reference signal REF described with reference to FIGS. 2 to 12. The voltage generator 1309 may generate the reference signal REFDQ that is provided to the receiver 1308. For example, the reference signal REFDQ of the memory controller 1300 may be the same as or different from the reference signal REFDQ of the memory device 1200. For another example, an external voltage generator that provides a power supply voltage to the memory controller 1300 and the memory device 1200 may generate and supply the reference signal REFDQ of the memory controller 1300 and the reference signal REFDQ of the memory device 1200. In this case, the reference signal REFDQ of the memory controller 1300 may be the same as the reference signal REFDQ of the memory device 1200.

Figure 16:
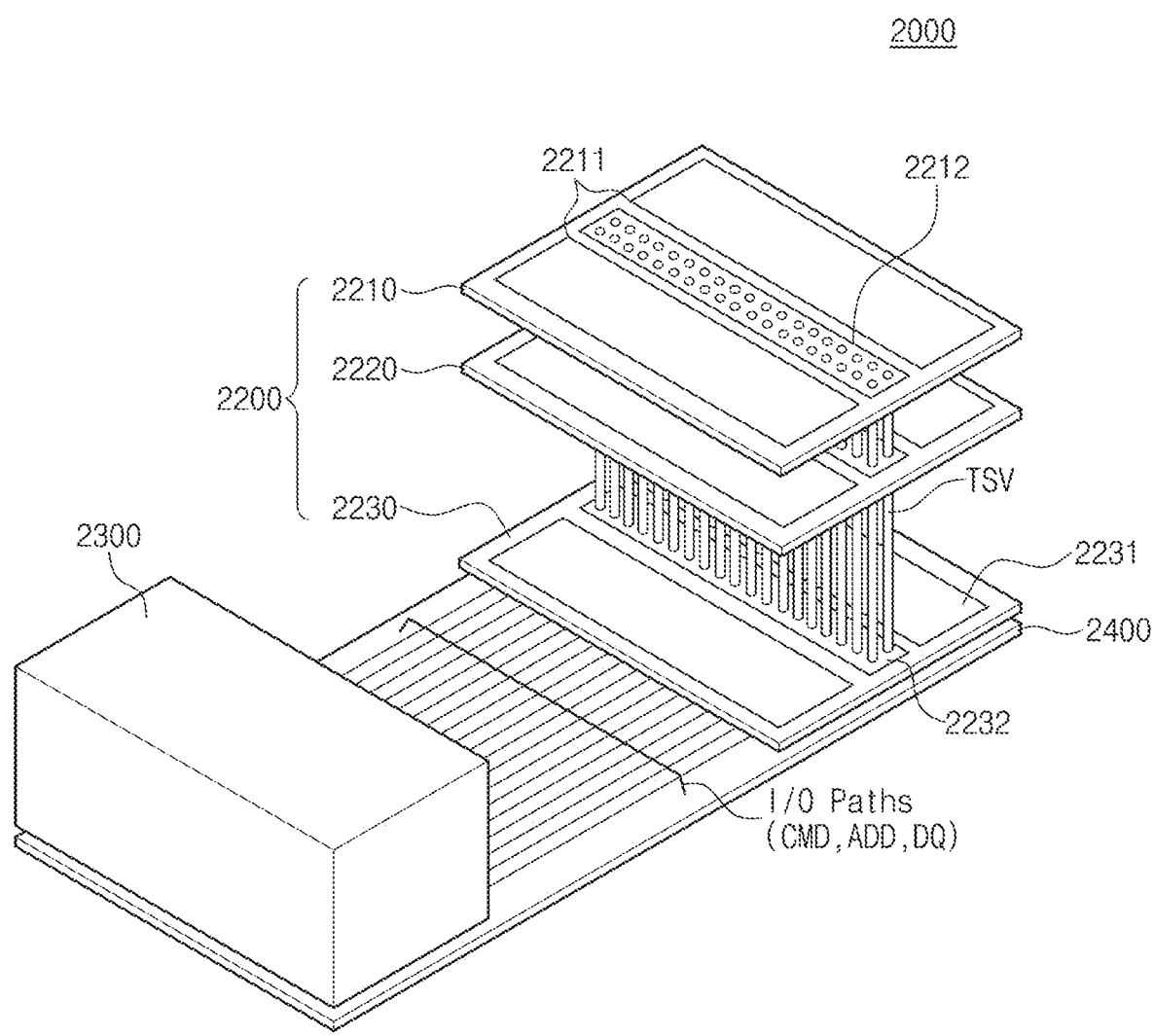
FIG. 16 illustrates an electronic device to which a receiver according to an embodiment of the inventive concept is applied.

FIG. 16 illustrates an electronic device to which a receiver according to an embodiment of the inventive concept is applied. An electronic device 2000 may include a memory device 2200, a system-on-chip (SoC) 2300, and a board 2400, as illustrated. The memory device 2200 may include memory dies 2210 and 2220 and a buffer die 2230, which are stacked in a vertical direction. The memory device 2200 may be a high bandwidth memory (HBM) device providing a high bandwidth. The memory device 2200 may be disposed on one surface of the board 2400, and solder balls or bumps may be disposed on one surface of the memory device 2200. The memory device 2200 and the board 2400 may be electrically interconnected through the solder balls or the bumps.

Through-silicon vias TSV may provide physical or electrical paths between the memory dies 2210 and 2220 and the buffer die 2230. For example, the through-silicon vias TSV may be arranged in the form of a matrix, and locations of the through-silicon vias TSV are not limited to the example of FIG. 16.

The memory die 2210 may include a first region 2211 and a second region 2212. The components of the memory device 1200 described with reference to FIG. 14 may be placed in the first region 2211. The through-silicon vias TSV may be placed in the second region 2212, or circuits for transmitting or receiving signals through the through-silicon vias TSV may be placed in the second region 2212. For example, at least one of the receivers 100a to 100j described with reference to FIGS. 2 to 12 may be placed in the second region 2212. The memory die 2220 may be implemented to be substantially the same as the memory die 2210.

The buffer die 2230 (or referred to as a "core die" or a "logic die") may include a first region 2231 and a second region 2232. At least one receiver that receives the command CMD, the address ADD, or the data input/output signal DQ transmitted through input/output (I/O) paths from the SoC 2300 may be placed in the first region 2231. The receiver placed in the first region 2231 may be one of the receivers 100a to 100j described with reference to FIGS. 2 to 12. Also, the components of the memory device 1200 described with reference to FIG. 14 may be placed in the first region 2231. The through-silicon vias TSV may be placed in the second region 2232, or circuits for transmitting or receiving signals through the through-silicon vias TSV may be placed in the second region 2212.

The SoC 2300 may be disposed on one surface of the board 2400, and solder balls or bumps may be disposed on one surface of the SoC 2300. The SoC 2300 and the board 2400 may be electrically interconnected through the solder balls or the bumps. The SoC 2300 may include the memory controller 1300 of FIG. 14, the components of the memory controller 1300, a processor, an on-chip memory, etc. The SoC 2300 may include at least one receiver that receives the data input/output signal DQ transmitted through the input/output (I/O) paths from the memory device 2200. The receiver may be one of the receivers 100a to 100j described with reference to FIGS. 2 to 12.

The board 2400 may provide an input/output path between the SoC 2300 and the memory device 2200. For example, the board 2400 may be a printed circuit board, a flexible circuit board, a ceramic substrate, or an interposer. In the case where the board 2400 is the interposer, the board 2400 may be implemented by using a silicon wafer. The input/output paths may be implemented within the board 2400.

Figure 17:
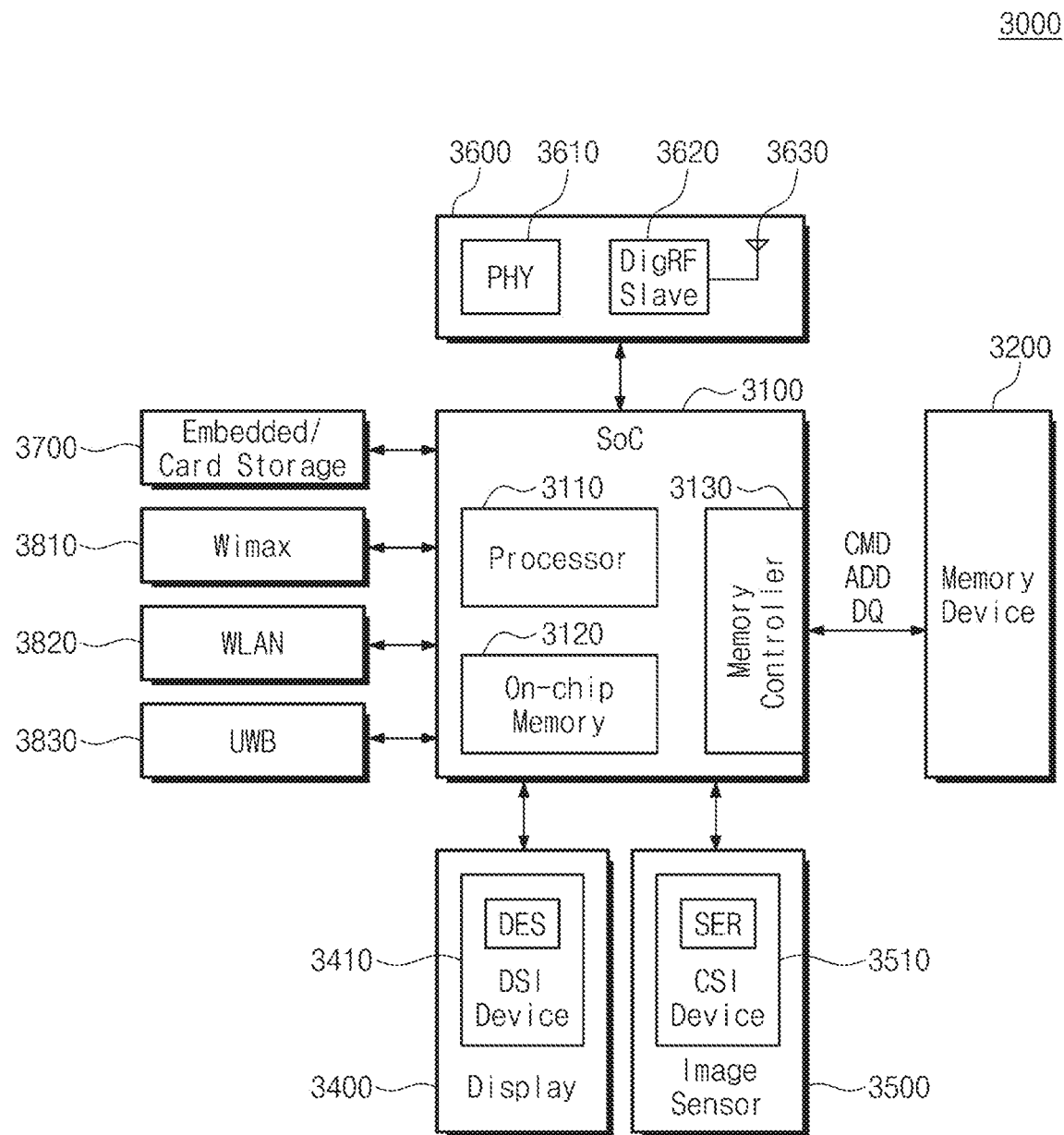
FIG. 17 illustrates a block diagram of an electronic device to which a receiver according to an embodiment of the inventive concept is applied.

FIG. 17 illustrates a block diagram of an electronic device to which a receiver according to an embodiment of the inventive concept is applied. An electronic device 3000 may be implemented with an electronic device that may use or support interfaces proposed by the mobile industry processor interface (MIPI) alliance. For example, the electronic device 3000 may be, but is not limited to, one of a server, a computer, a smartphone, a tablet, personal digital assistant (PDA), a digital camera, a portable multimedia player (PMP), a wearable device, an Internet of Things (IoT) device, a mobile device, etc.

The electronic device 3000 may include a SoC 3100 and a memory device 3200. The SoC 3100 may include a processor 3110, an on-chip memory 3120, and a memory controller 3130. The SoC 3100 may be referred to as an "application processor". The processor 3110 may execute various programs stored in the on-chip memory and may control the memory controller 3130. The memory controller 3130 may include the components of the memory controller 1300 of FIG. 15. The memory device 3200 may include the components of the memory device 1200 of FIG. 14. The memory controller 3130 may transmit the command CMD, the address ADD, and the data input/output signal DQ to the memory device 3200. The memory device 3200 may transmit the data input/output signal DQ to the memory controller 3130.

The electronic device 3000 may further include a display 3400 communicating with the SoC 3100. The SoC 3100 may communicate with a display serial interface (DSI) device 3410 in compliance with an DSI. An optical deserializer DES may be implemented in the DSI device 3410. The electronic device 3000 may further include an image sensor 3500 communicating with the SoC 3100. The SoC 3100 may communicate with a camera serial interface (CSI) device 3510 in compliance with a CSI. An optical serializer SER may be implemented in the CSI device 3510.

The electronic device 3000 may further include a radio frequency (RF) chip 3600 that communicates with the SoC 3100. The RF chip 3600 may include a physical layer 3610, a DigRF slave 3620, and an antenna 3630. For example, the physical layer 3610 and the SoC 3100 may exchange data with each other in compliance with a DigRF interface proposed by the MIPI alliance.

The electronic device 3000 may further include embedded/card storage 3700. The embedded/card storage 3700 may store data provided from the SoC 3100. The electronic device 3000 may communicate with an external system through worldwide interoperability for microwave access (WiMAX) 3810, a wireless local area network (WLAN) 3820, an ultra-wide band (UWB) 3830, etc.

In an embodiment, each of the components 3100, 3110, 3120, 3130, 3200, 3400, 3410, 3500, 3510, 3600, 3610, 3620, 3630, 3700, 3810, 3820, and 3830 of the electronic device 3000 may include at least one receiver that receives data from any other component of the electronic device 3000. The receiver may be one of the receivers 100a to 100j described with reference to FIGS. 2 to 12.

FIG. 18 is a block diagram illustrating an electronic device including a first SoC to which a receiver according to an embodiment of the inventive concept is applied and a second SoC communicating with the first SoC. An electronic device 4000 may include a first SoC 4100 and a second SoC 4200.

The first SoC 4100 and the second SoC 4200 may communicate with each other based on the open system interconnection (OSI) 7-layer structure proposed in the international standard organization. For example, each of the first SoC 4100 and the second SoC 4200 may include an application layer AL, a presentation layer PL, a session layer SL, a transport layer TL, a network layer NL, a data link layer DL, and a physical layer PHY.

The layers of the first SoC 4100 may physically or logically communicate with the corresponding layers of the second SoC 4200. The application layer AL, the presentation layer PL, the session layer SL, the transport layer TL, the network layer NL, the data link layer DL, and the physical layer PHY of the first SoC 4100 may logically or physically communicate with the application layer AL, the presentation layer PL, the session layer SL, the transport layer TL, the network layer NL, the data link layer DL, and the physical layer PHY of the second SoC 4200, respectively.

In an embodiment, the physical layer PHY of the first SoC 4100 may include a receiver 4110. The receiver 4110 may be one of the receivers 100a to 100j described with reference to FIGS. 2 to 12. The physical layer PHY of the second SoC 4200 may include a transmitter 4210 that transmits a transmission signal over a channel 4300. The transmitter 4210 and the channel 4300 may be the transmitter 11 and the channel 12 of FIG. 1, respectively.

A receiver according to an embodiment of the inventive concept may compensate a common-mode offset between a transmission signal and a reference signal, may prevent distortion of the transmission signal due to a reflection noise from being amplified, and may improve a voltage margin in which the transmission signal is effectively determined.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A receiver, comprising:
an amplifier configured to receive a transmission signal and generate a first output signal and a second output signal at a first node and a second node by amplifying a first voltage difference between the transmission signal and a reference signal; and
an equalizer connected to the first node and the second node, the equalizer configured to receive the transmission signal and compensate a common-mode offset between the first output signal and the second output signal based on a second voltage difference between an average voltage level of the transmission signal and the reference signal.

2. The receiver of claim 1, wherein the common-mode offset is a third voltage difference between an average voltage level of the first output signal and an average voltage level of the second output signal.

3. The receiver of claim 1, wherein the equalizer includes:
a first transistor connected to the first node; and
a second transistor connected to the second node, and
the first transistor and the second transistor are configured to adjust a voltage level of the first output signal and a voltage level of the second output signal based on the second voltage difference.

4. The receiver of claim 3, wherein the amplifier is a first amplifier, and
the equalizer further includes:
a second amplifier configured to generate a third output signal and a fourth output signal by amplifying the first voltage difference between the transmission signal and the reference signal; and
a filtering circuit configured to generate a fifth output signal and a sixth output signal by filtering the third output signal and the fourth output signal.

5. The receiver of claim 4, wherein a third voltage difference between the fifth output signal and the sixth output signal is determined based on the second voltage difference.

6. The receiver of claim 4, wherein the first transistor is further configured to adjust the voltage level of the first output signal depending on the fifth output signal, and
the second transistor is further configured to adjust the voltage level of the second output signal depending on the sixth output signal.

7. The receiver of claim 1, wherein the equalizer is a first equalizer, and
the receiver further includes a second equalizer configured to amplify a third voltage difference between the first output signal and the second output signal.

8. The receiver of claim 1, wherein the amplifier includes:
a first transistor configured to receive the transmission signal through a gate terminal;
a second transistor configured to receive the reference signal through a gate terminal; and
a source degeneration circuit connected between a source terminal of the first transistor and a source terminal of the second transistor.

9. A receiver comprising:
an amplifier configured to receive a transmission signal and generate a first output signal and a second output signal at a first node and a second node by amplifying a voltage difference between the transmission signal and a reference signal; and
an equalizer connected to the first node and the second node, the equalizer configured to: (i) generate a first feedback signal and a second feedback signal based on the first output signal and the second output signal, respectively, and (ii) compensate a common-mode offset between the first output signal and the second output signal based on the first feedback signal, which is derived by passing the first output signal through a first passive impedance element, and the second feedback signal, which is derived by passing the second output signal through a second passive impedance element;
wherein the equalizer includes:
a first transistor connected to the first node and configured to adjust a voltage level of the first output signal depending on the first feedback signal; and
a second transistor connected to the second node and configured to adjust a voltage level of the second output signal depending on the second feedback signal;
a third transistor and a fourth transistor configured to generate a third output signal and a fourth output signal by amplifying a voltage difference between the first output signal and the second output signal;
a fifth transistor and a sixth transistor configured to generate a fifth output signal and a sixth output signal by amplifying a voltage difference between the third output signal and the fourth output signal; and
a filtering circuit configured to generate the first feedback signal and the second feedback signal, respectively by filtering the fifth output signal and the sixth output signal;
wherein the first passive impedance element is a first resistor; and
wherein the second passive impedance element is a second resistor.

10. A receiver comprising:
an amplifier configured to receive a transmission signal and generate a first output signal and a second output signal at a first node and a second node by amplifying a voltage difference between the transmission signal and a reference signal; and
an equalizer connected to the first node and the second node, the equalizer configured to generate a first feedback signal and a second feedback signal based on the first output signal and the second output signal respectively and compensate a common-mode offset between the first output signal and the second output signal based on the first feedback signal, which has a voltage level determined based on an average voltage level of the first output signal, and the second feedback signal, which has a voltage level determined based on an average voltage level of the second output signal.

11. The receiver of claim 10, wherein the equalizer further includes:
a filtering circuit configured to generate the first feedback signal and the second feedback signal respectively by filtering the first output signal and the second output signal.

12. The receiver of claim 9, wherein the equalizer is a first equalizer; and wherein the receiver further includes a second equalizer configured to amplify a voltage difference between the first output signal and the second output signal of the amplifier.

13. A receiver comprising:
a first transistor configured to receive a single-ended signal;
a second transistor configured to receive a reference signal;
a third transistor connected to a first node to which the first transistor is connected; and
a fourth transistor connected to a second node to which the second transistor is connected, wherein
the first transistor and the second transistor are configured to generate a first output signal and a second output signal at the first node and the second node by amplifying a first voltage difference between the single-ended signal and the reference signal, and
the third transistor and the fourth transistor are configured to compensate a common-mode offset between the first output signal and the second output signal based on a second voltage difference between an average voltage level of the single-ended signal and the reference signal.

14. The receiver of claim 13, wherein the common-mode offset is a third voltage difference between an average voltage level of the first output signal and an average voltage level of the second output signal.

15. The receiver of claim 13, further comprising a fifth transistor and a sixth transistor configured to receive the single-ended signal and the reference signal, respectively, and generate a third output signal and a fourth output signal by amplifying the first voltage difference; and a filtering circuit configured to generate a fifth output signal and a sixth output signal, respectively, by filtering the third output signal and the fourth output signal, wherein the third transistor is further configured to adjust a voltage level of the first output signal depending on the fifth output signal, and the fourth transistor is further configured to adjust a voltage level of the second output signal depending on the sixth output signal.

16. The receiver of claim 13, wherein the third transistor and the fourth transistor are further configured to adjust a voltage level of the first output signal and a voltage level of the second output signal depending on a first feedback signal and a second feedback signal generated based on the first output signal and the second output signal.

17. The receiver of claim 13, further comprising:

a fifth transistor connected to the first node through a gate terminal and connected to the second node through a drain terminal; and a sixth transistor connected to the second node through a gate terminal and connected to the first node through a drain terminal.

18. The receiver of claim 13, further comprising:

a fifth transistor connected to the first node through a gate terminal; and a sixth transistor connected to the second node through a gate terminal, and wherein the fifth transistor and the sixth transistor are configured to generate a third output signal and a fourth output signal by amplifying a third voltage difference between the first output signal and the second output signal.

\* \* \* \* \*